United States Patent
Tsuchi et al.

(10) Patent No.: US 7,482,843 B2
(45) Date of Patent: Jan. 27, 2009

(54) SIGNAL AMPLIFIER

(75) Inventors: Hiroshi Tsuchi, Kanagawa (JP); Osamu Ishibashi, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 109 days.

(21) Appl. No.: 11/680,669

(22) Filed: Mar. 1, 2007

(65) Prior Publication Data

US 2007/0205807 A1    Sep. 6, 2007

(30) Foreign Application Priority Data

Mar. 2, 2006    (JP)    ............................. 2006-056438

(51) Int. Cl.
*H03F 3/45* (2006.01)
(52) U.S. Cl. .............................. 327/55; 327/51; 327/54
(58) Field of Classification Search ........................ None
See application file for complete search history.

(56) References Cited

U.S. PATENT DOCUMENTS

| | | | |
|---|---|---|---|
| 4,858,195 A | | 8/1989 | Soneda |
| 6,366,226 B2 * | | 4/2002 | Broekaert .................... 341/133 |
| 7,245,521 B2 * | | 7/2007 | Mori et al. ................... 365/156 |
| 2006/0171194 A1 * | | 8/2006 | Lowrey et al. ............... 365/154 |
| 2008/0013388 A1 * | | 1/2008 | Asano et al. ................. 365/200 |

FOREIGN PATENT DOCUMENTS

JP    62-273694 A    11/1987
JP    5-218825 A    8/1993

* cited by examiner

*Primary Examiner*—Quan Tra
*Assistant Examiner*—Hiep Nguyen
(74) *Attorney, Agent, or Firm*—Sughrue Mion, PLLC

(57) ABSTRACT

The amplifier includes first and second inverters that form a flip-flop. In this flip-flop, an input of first inverter is connected to an output of the second inverter, and an output of the first inverter is connected to an input of the second inverter. Control terminals of at least one transistors (MN1, MN2) of first and second transistor pairs (MP1, MN1 and MP2, MN2) that constitute first and second inverters, respectively, are connected to inputs of first and second inverters through first and second capacitances (C1, C2), respectively. At resetting, inputs (1, 2) and outputs (OUT, OUTB) of first and second inverters are not mutually cross-connected, wherein a reference signal (VR) is supplied in common to inputs (1, 2) of the first and second inverters. The one transistors (MN1, MN2) are diode-connected. Voltage differences between reference signal (VR) and respective control terminals of the one transistors are stored in the first and second capacitances (C1, C2), respectively. At signal input, diode connections of the one transistors (MN1, MN2) are released. Inputs (1, 2) of the first and second inverters are disconnected from the reference signal. First and second input signals (S1, S2) are supplied to inputs (1, 2), respectively. Then, inputs and outputs of first and second inverters are mutually cross-connected, forming the flip-flop. The amplifier with high-speed and highly reliable operation does not depend on variations in devices therein.

25 Claims, 24 Drawing Sheets

<CONTROL OVER SWITCHES>

<PERIOD T1>

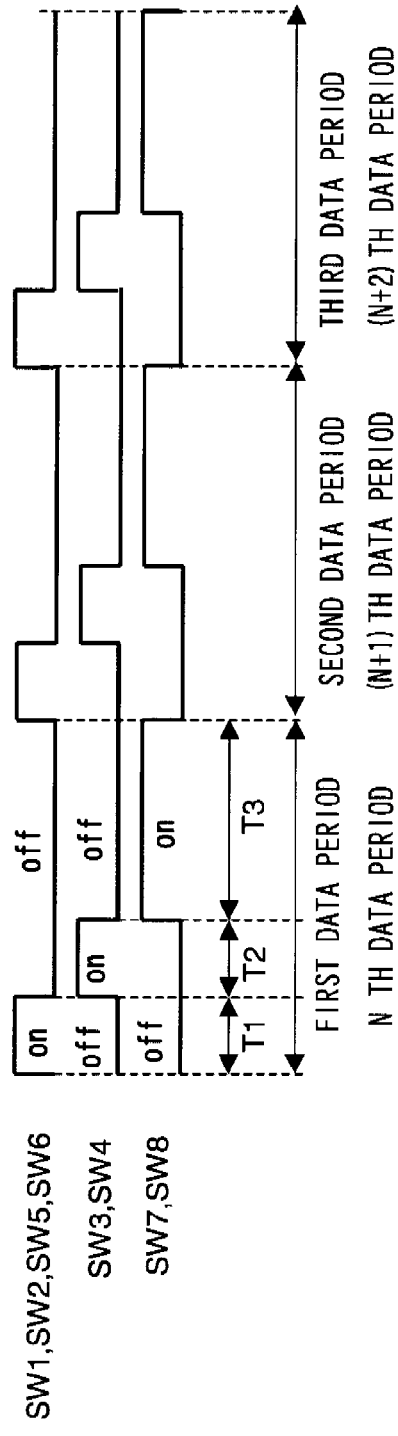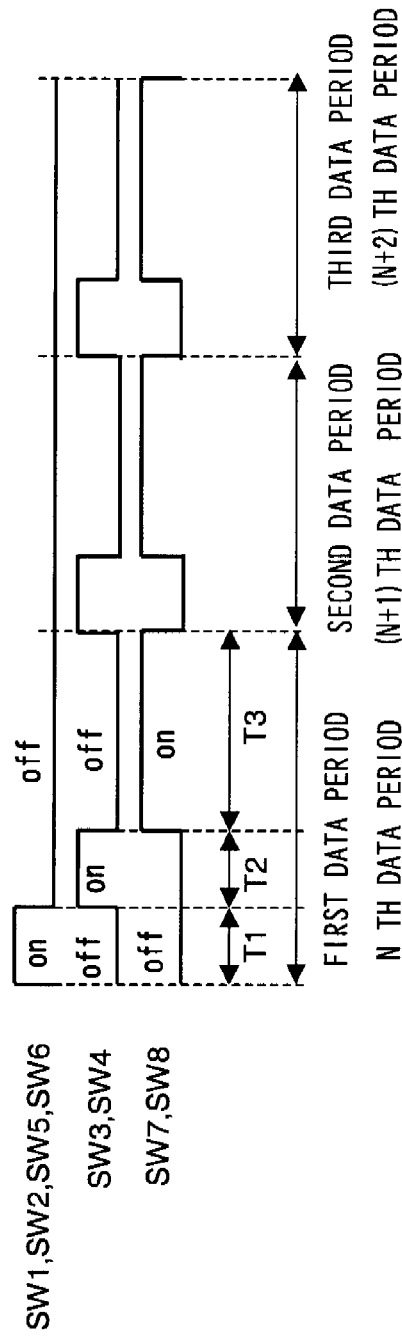

<PERIOD T2>

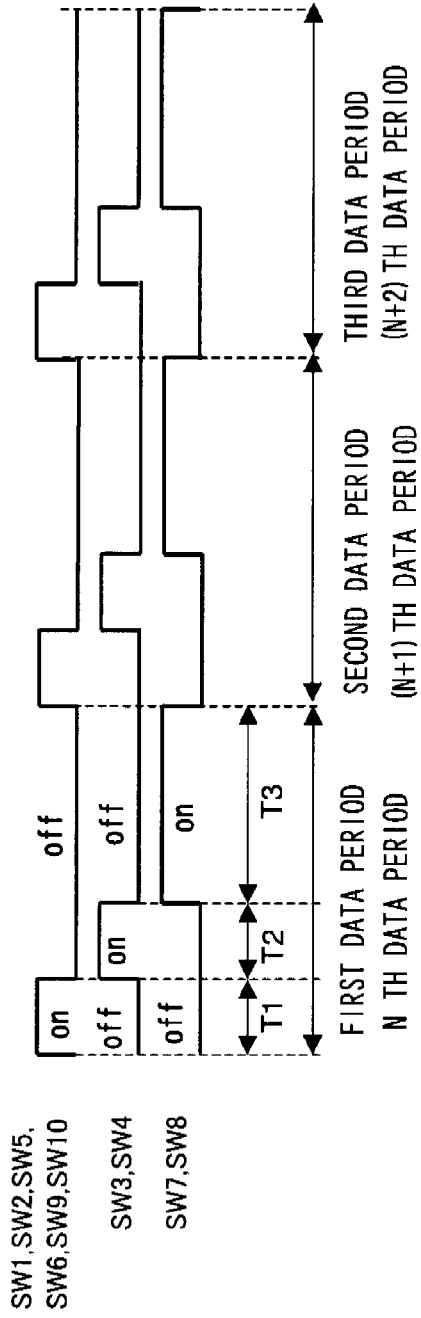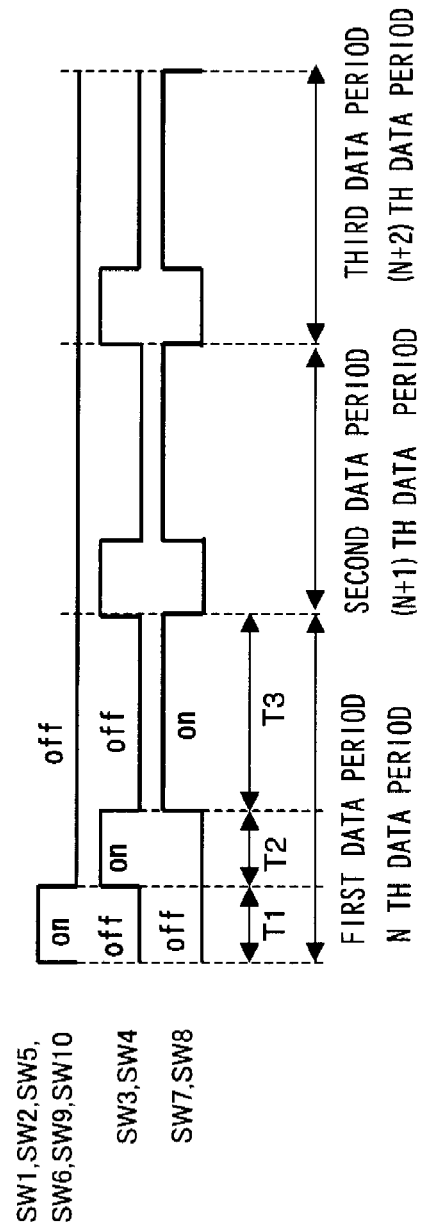

\<STEP 2\>

US 7,482,843 B2

SIGNAL AMPLIFIER

FIELD OF THE INVENTION

The present invention relates to signal amplifiers. More specifically, the invention relates to an amplifier suitable for being applied to a digital signal amplifier such as a sense amplifier or a voltage comparator, which inputs a digital signal and amplifies the input digital signal.

BACKGROUND OF THE INVENTION

FIG. 13 is a diagram showing a configuration of a conventional sense amplifier circuit constituted from a flip-flop type voltage comparator circuit. This sense amplifier circuit (flip-flop type voltage comparator circuit) cancels an offset resulting from manufacturing variations in transistors. More specifically, referring to FIG. 13, this sense amplifier circuit includes PMOS transistors MP91 and MP92 with sources thereof connected in common to a power supply Ssp, drains thereof connected to bit lines (a bit line pair of) BL1 and BL2, respectively, and gates thereof connected to the bit lines BL2 and BL1, respectively, and NMOS transistors MN91 and MN92 with sources thereof connected in common to a power supply Ssn, drains thereof connected to the bit line BL1 through a switch SW92 and to the bit line BL2 through a switch SW94, respectively, and gates thereof connected to the bit line BL2 through a capacitance C91 and to the bit line BL1 through a capacitance C92, respectively. A switch SW91 is disposed between a gate of the NMOS transistor MN91 and a drain of the NMOS transistor MN91, while a switch SW93 is disposed between a gate of the NMOS transistor MN92 and a drain of the NMOS transistor MN92.

FIG. 14 is a timing waveform diagram for explaining an operation of the circuit in FIG. 13. FIGS. 15, 16, and 17 are diagrams showing connections of the circuit in FIG. 13 at respective timings shown in FIG. 14. Incidentally, the switches that are in an off state in FIG. 13 are not illustrated in FIGS. 15, 16, and 17.

In the following an analysis is given according to the present invention.

When the power supplies Ssn and Ssp and the bit lines BL1 and BL2 are set to a potential VCC/2, and when the switches SW91, SW92, SW93, and SW94 are turned on, as shown in FIG. 15, potentials at both ends of the capacitances C91 and C92 become the same potential of VCC/2, respectively. An electric charge in each of the capacitances C91 and C92 is reset to nil.

When the switches SW92 and SW94 that were in the on state in FIG. 15 are turned off (refer to a timing (b) in FIG. 14) and when the power supply Ssn is reduced from the potential VCC/2 to a potential Vdc (refer to a period Ta in FIG. 14), as shown in FIG. 16, the NMOS transistors MN91 and MN92 are turned on. Thus, a source follower operation of a diode connection occurs at each of the transistors. This causes a gate voltage of the NMOS transistor MN91 to become (Vdc+Vtn91) and a gate voltage of the NMOS transistor MN92 to become (Vdc+Vtn92), in which Vtn91 and Vtn92 are threshold voltages of the NMOS transistors MN91 and MN92, respectively. A potential difference between the gate voltage of the MOS transistor MN91 and the potential VCC/2 and a potential difference between the gate voltage of the MOS transistor MN92 and the potential VCC/2 are held in the capacitances 91 and 92, respectively.

As shown in FIG. 17, the switches SW91 and SW93 which were in the on state in FIG. 16 are turned off, the switches SW92 and SW94 that were in the off state in FIG. 16 are turned on, the power supply Ssn becomes a GND potential, and the power supply Ssp becomes a power supply voltage VCC (refer to a timing (c) in FIG. 14). Since source potentials Ssn of the NMOS transistors MN91 and MN92 are reduced, gate-to-source voltages of the NMOS transistors MN91 and MN92 increase, and the same current flows through each of the transistors.

When a voltage (VCC/2+Δ) is applied to the bit line BL1 as data, the gate voltages of the transistors MP92 and MN92 increase just by the voltage Δ, respectively. For this reason, a potential at the bit line BL2 is reduced because a drain current (source-to-drain current) of the PMOS transistor MP92 is reduced and a drain current (drain-to-source current) of the NMOS transistor MN92 is increased. A potential at the bit line BL1 is increased because a drain current (source-to-drain current) of the PMOS transistor MP91 is increased and a drain current (drain-to-source current) of the NMOS transistor MN91 is reduced due to reduction of a potential at the bit line BL2.

As a result, it becomes that BL1=VCC, and BL2=GND, and the bit lines become stabilized.

In the flip-flop type voltage comparator circuit in FIG. 13, the potential difference (Vt+Vdc) is stored in each of the capacitances due to the source follower operations of the transistors MN91 and MN92 which are diode-connected in the period Ta (refer to FIG. 14). An operation on data, which does not depend on the threshold voltage Vt can be thereby performed.

As a configuration for canceling the offset caused by the manufacturing variations in transistors in the flip-flop type voltage comparator circuit, a configuration as shown in FIG. 18, for example, is known (refer to Patent Document 2). FIG. 19 is a timing diagram showing on and off control over switches in FIG. 18, and FIGS. 20 through 22 are diagrams showing connecting configurations of a circuit in FIG. 18 in respective steps in FIG. 19, respectively.

In the following an analysis is given according to the present invention.

Referring to FIG. 18, this flip-flop type voltage comparator circuit includes a PMOS transistor MP83 with a source thereof connected to a power supply VDD and a gate thereof connected to a signal STBB (which is a complementary signal of a signal STB), PMOS transistors MP81 and MP82 with sources thereof connected to a drain of the PMOS transistor MP83, an NMOS transistor MN83 with a source thereof connected to a power supply VSS and a gate thereof connected to the signal STB, and NMOS transistors MN81 and MN82 with sources thereof connected in common to a drain of the NMOS transistor MN83 and drains thereof connected to drains of the PMOS transistors MP81 and MP82, respectively.

Gates of the PMOS transistor MP81 and the NMOS transistor MN81 are connected in common to an input signal VI through a capacitance C81 and a switch SW85. Gates of the PMOS transistor MP82 and the NMOS transistor MN82 are connected in common to a reference signal VR through a capacitance C82 and a switch SW87. Between the gates of the PMOS transistor MP81 and the NMOS transistor MN81 connected in common and the drains of the PMOS transistor MP81 and the NMOS transistor MN81 connected in common, a switch SW83 is provided. Between the gates of the PMOS transistor MP82 and the NMOS transistor MN82 connected in common and the drains of the PMOS transistor MP82 and the NMOS transistor MN82 connected in common, a switch SW84 is provided. Between the drains of the PMOS transistor MP81 and the NMOS transistor MN81 connected in common and the gates of the PMOS transistor MP82 and the NMOS transistor MN82 connected in common, a switch SW81 is provided. Between the drains of the PMOS transistor MP82 and the NMOS transistor MN82 connected in common and the gates of the PMOS transistor MP81 and the NMOS transistor MN81 connected in common, a switch SW82 is provided. A switch SW86 is provided between a connecting point between the capacitance C81 and the switch SW85 and a connecting point between the capacitance C82 and the switch SW87. On and off control over the switches SW81 to SW87 is performed by a control signal (not shown).

In this flip-flop type voltage comparator circuit, the common gate of the MOS transistors MN81 and MP81 that constitute an inverter and the common gate of the MOS transistors MN82 and MP82 that constitute an inverter are each reset to a logic inversion voltage (voltage at which an input of the inverter coincides with an output of the inverter) in advance, and to one of the common gates, a potential difference between the reference signal and an input data signal, that becomes positive or negative with respect to the reference signal is given. Then, the strobe signal STB and the inverted signal STBB of the strobe signal STB are given to the gates of the MOS transistors MN83 and MP83, respectively. When the flip-flop circuit is activated, a positive feedback is applied, and the potential difference between the common gates is amplified. With this arrangement, even if the potential difference between the reference signal and the data signal is small, voltage comparison between these signals can be performed at high speed. An operation of the voltage comparison will be described below.

Referring to FIGS. 19 and 20, in step 1, the strobe signal STB is driven HIGH, the switches SW81 and SW82 are turned off, the switches SW83, SW84, and SW86 are turned on, the switch SW85 is turned off, and the switch SW87 is turned on. A drain and the gate of each of the PMOS transistor MP81 and the NMOS transistor MN81 that constitute the inverter are connected (diode-connected), and a drain and the gate of each of the PMOS transistor MP82 and the NMOS transistor MN82 that constitutes the inverter are connected (diode-connected). In this case, the input of each of the inverters coincides with the output of each of the inverters, and respective voltages VA and VB of the inverters become logic inversion voltages. Then, potential differences between the reference signal VR and the respective logic inversion voltages VA and VB of the inverters are stored in the capacitances C81 and C82, respectively.

The logic inversion voltages VA and VB become different voltages when variations in elements are present. However, by holding a potential difference between each logic inversion voltage and the reference signal VR in the corresponding capacitance, an operation that does not depend on the variations in elements becomes possible.

Next, referring to FIGS. 19 and 21, in step 2, the strobe signal STB is driven LOW, the signal STBB is driven HIGH, and the MOS transistors MP83 and MN83 are turned off. The switches SW81 and SW82 are kept off, the switches SW83, SW84, and SW86 are turned off, and the switch SW85 is turned on. The switch SW87 is kept on. The common source of the NMOS transistors MN81 and MN82 and the common source of the PMOS transistors MP81 and MP82 are brought to a floating state. The reference signal VR is consecutively applied to one end of the capacitance C82, while the input signal VI is consecutively applied to one end of the capacitance C81. With this arrangement, a voltage VI is added to a voltage (VA−VR) stored in the capacitance C81 in step 1, and gate voltages of the MOS transistors MN81 and MP81 thereby become VI+(VA−VR)=(VI−VR)+VA. That is, the gate voltages of the MOS transistors MN81 and M81 become a voltage shifted from a logic inversion voltage VA just by a voltage difference (VI−VR) between the input signal VI and the reference signal VR.

Referring to FIGS. 19 and 22, in step 3, the strobe signal STB is driven HIGH, the switches SW81 and SW82 are turned on, the switches SW83, SW84, and SW86 are kept off, and the switches SW85 and SW87 are turned off. When the MOS transistors MP83 and MN83 are turned on and when the flip-flop circuit is activated, a voltage VO at the common drain of the MOS transistors MP81 and MN81 (an output voltage of the flip-flop circuit) changes according to the common gate voltage {(VI−VR)+VA}.

When VI>VR, the common gate of the MOS transistors MN81 and MP81 that constitute the inverter has a higher potential than the voltage VA. Thus, the output voltage VO is lowered when the flip-flop circuit (constituted from the MOS transistors MN81, MN82, MP81, and MP82) is activated, resulting in VO=VSS, where the output voltage VO is stabilized.

On the other hand, when VI<VR, the common gate of the MOS transistors MN81 and MP81 has a lower potential than the voltage VA. Thus, the output voltage VO is elevated when the flip-flop circuit is activated, resulting in VO=VDD.

[Patent Document 1]
  Japanese Patent Kokai Publication No. JP-A-62-273694

[Patent Document 2]
  Japanese Patent Kokai Publication No. JP-A-5-218825

SUMMARY OF THE DISCLOSURE

The disclosures of the above mentioned Documents are incorporated herein with reference thereto.

The flip-flop circuit is suitable for the sense amplifier for a memory and a data receiver circuit of a display driver. In the case with a Si (silicon) semiconductor, an influence caused by the variations in elements (or components) making up the same amplifier may increase due to increasingly finer geometries and increasingly lower voltages, thus leading to a malfunction or a reduction in sensitivity. In the case with a TFT (thin film transistor), when the memory or driver is integrated on a glass substrate, the influence caused by the variations in elements may increase. By and large, the same problem as that in the case with the Si semiconductor may arise.

The source follower operation in the conventional sense amplifier circuit shown in FIG. 13 suffers from a problem that it requires certain time for the source follower operation to be stabilized, and it is therefore difficult to detect the voltage Vt (threshold voltage) by the source follower operation at high speed. Further, four power supplies (VCC, 0, VCC/2, and Vdc) are required.

In the conventional flip-flop type voltage comparator shown in FIG. 18, an input signal VI is applied to common gates of the MOS transistors MP81 and MN81 that constitute an inverter, through a capacitance C81. In this case, the common gates are connected to switches SW82 and SW83 as well. Thus, there is a problem that voltage accuracy of the input signal to be applied to the common gates tends to be reduced, and an operating margin is thereby low, due to capacitive coupling between the capacitance C81 and parasitic capacitances (MN81, MP81, SW82, and SW83). Further, there is also a problem that correction for each data is essential and a once detected correction value cannot be used for a plurality of data, so that it is difficult to support a high-speed operation.

Thus there is much desired in the art.

According to one aspect of the present invention, there is provided at least a solution for one of the problems aforementioned, which is generally configured as follows.

According to an aspect of the present invention, there is provided a novel signal amplifier. The signal amplifier comprises:

first and second inverters, an input of the first inverter being connected to an output of the second inverters and an output of the first inverter being connected to an input of the second inverter, thereby forming a flip-flop;

a control terminal of at least one transistor of first transistor pair constituting the first inverter being connected through first capacitance to the input of the first inverter;

a control terminal of at least one transistor of second transistor pair constituting the second inverter being connected through second capacitance to the input of the second inverter;

at a time of resetting, with the inputs and the outputs of the first and second inverters being not mutually cross-connected, the inputs of the first and second inverters receiving a reference signal in common, the one transistors of the first and second transistor pairs being diode-connected, voltage differences between the reference signal and the respective control terminals of the one transistors being stored in the first capacitance and second capacitance, respectively; and at a time of signal input, the inputs of the first and second inverters being disconnected from the reference signal, diode connections of the one transistors being released, the inputs of the first and second inverters receiving first and second input signals, respectively, and then the inputs and outputs of the first and second inverters being mutually cross-connected (i.e. the output of the first inverter being connected to the input of the second inverter, and the input of the first inverter being connected to the output of the second inverter), thereby forming the flip-flop.

According to another aspect (second aspect) of the present invention, a signal amplifier may comprise:

first and second inverters, an input of first inverter being connected to an output of the second inverter and an output of the first inverter being connected to an input of second inverter, thereby forming a flip-flop. A control terminal of at least one transistor of first transistor pair constituting the first inverter may be connected through first capacitance to the input of the first inverter. A control terminal of at least one transistor of second transistor pair constituting the second inverter may be connected through second capacitance to the input of the second inverter. At a time of resetting, with the inputs and the outputs of the first and second inverters not mutually cross-connected, the inputs of the first and second inverters may receive a reference signal in common. The one transistors of the first and second transistor pairs may be diode-connected. Control terminals of the other transistors may receive first and second bias signals, respectively. Voltage differences between the reference signal and the respective control terminals of the one transistors may be stored in the first capacitance and second capacitance, respectively. At a time of signal input, the inputs of the first and second inverters may be disconnected from the reference signal, the control terminals of the other transistors may be disconnected from the first and second bias signals, the diode connections of the one transistors may be released, the inputs of the first and second inverters may receive first and second input signals, respectively, and then the inputs and the outputs of the first and second inverters may be mutually cross-connected (i.e. the output of the first inverter being connected to the input of the second inverter, and the input of the first inverter being connected to the output of the second inverter), thereby forming the flip-flop.

In the present invention, the signal amplifier may include third and fourth capacitances connected between the inputs of the first and second inverters and the respective control terminals of the other transistors, respectively, and at the time of resetting, voltage differences between the reference signal and the respective control terminals of the other transistors may be stored in the third and fourth capacitances, respectively.

According to an aspect (third aspect) of the present invention there is provided a signal amplifier comprising:

a first transistor of a first conductivity type and the first transistor of a second conductivity type connected in series between a first power supply and a second power supply, thereby forming a first inverter;

a second transistor of the first conductivity type and the second transistor of the second conductivity type connected in series between the first power supply and the second power supply, thereby forming a second inverter;

a first capacitance with one end thereof connected to a control terminal of the first transistor of the first conductivity type and with the other end thereof connected to a control terminal of the first transistor of the second conductivity type; and a second capacitance with one end thereof connected to a control terminal of the second transistor of the first conductivity type and with the other end connected to a control terminal of the second transistor of the second conductivity type;

the control terminals of the first and second transistors of the first conductivity type being set to inputs of the first and second inverters, respectively. The signal amplifier includes a control circuit that exercises control over switching among the following first through three connection states.

In the first connection state, an output of the first inverter is disconnected to an input of the second inverter, and an output of the second inverter is disconnected to an input of the first inverter. Then, to the inputs of the first and second inverters, a reference signal is connected in common, and the first and second transistors of the second conductivity type are diode-connected, respectively.

In the second connection state, first and second input signals are supplied to the inputs of the first and second inverters, respectively, and the diode connections of the first and second transistors of the second conductivity type are released.

In the third connection state, the output of the first inverter is connected to the input of the second inverter, and the input of the first inverter is connected to the output of the second inverter.

In the third connection state in the present invention, it may be so arranged that the inputs of the first and second inverters are disconnected to input terminals for the first and second input signals, respectively.

In the present invention, the control circuit may comprise:

a first switch connected between a supply terminal for the reference signal and the input of the first inverter and a second switch connected between the supply terminal for the reference signal and the input of the second inverter;

a third switch connected between an input terminal for the first input signal and the input of the first inverter and a fourth switch connected between an input terminal for the second input signal and the input of the second inverter;

a fifth switch connected between the control terminal of the first transistor of the second conductivity type and the output of the first inverter;

a sixth switch connected between the control terminal of the second transistor of the second conductivity type and the output of the second inverter;

a seventh switch connected between the output of the first inverter and the input of the second inverter; and an eighth switch connected between the output of the second inverter and the input of the first inverter.

In the present invention, the signal amplifier may be formulated as follows:

during a first period, the first switch, the second switch, the fifth switch, and the sixth switch are turned on, the third switch and the fourth switch are turned off, and the seventh switch and the eighth switch are turned off, thereby constituting the first connection state;

during a second period, the first switch, the second switch, the fifth switch, the sixth switch are turned off, the third switch and the fourth switch are turned on, and the seventh switch and the eighth switches are kept off, thereby constituting the second connection state; and during a third period, the first switch, the second switch, the fifth switch, and the sixth switch are kept off, the third switch and the fourth switch are turned off, the seventh switch and the eighth switch are turned on, thereby constituting the third connection state.

According to a further aspect (fourth aspect) of the present invention there is provided a signal amplifier comprising:

a first transistor of a first conductivity type and a first transistor of a second conductivity type connected in series between a first power supply and a second power supply, thereby forming a first inverter;

a second transistor of the first conductivity type and a second transistor of the second conductivity type connected in series between the first power supply and the second power supply, thereby forming a second inverter;

first and third capacitances connected in series between a control terminal of the first transistor of the second conductivity type and a control terminal of the first transistor of the first conductivity type; and second and fourth capacitances connected in series between a control terminal of the second transistor of the second conductivity type and a control terminal of the second transistor of the first conductivity type;

a connecting mode between the first capacitance and the third capacitance being an input of the first inverter;

a connecting mode between the second capacitance and the fourth capacitance being an input of the second inverter.

The signal amplifier further comprises:

a control circuit that exercises control over switching among the following first through third connection states.

In the first connection state of the present invention, an output of the first inverter is disconnected to the input of the second inverter, and an output of the second inverter is disconnected to the input of the first inverter. A bias signal is applied in common to the control terminals of the first and second transistors of the first conductivity type, a reference signal is supplied in common to the inputs of the first and second inverters, and the first and second transistors of the second conductivity type are diode-connected, respectively.

In the second connection state, the diode connections of the first and second transistors of the second conductivity type are released. A first input signal is supplied to the input of the first inverter, and a second input signal is supplied to the input of the second inverter.

In the third connection state, the output of the first inverter is connected to the input of the second inverter, and the input of the first inverter is connected to the output of the second inverter.

In the present invention, it may be so arranged that in the third connection state, the input of the first inverter is disconnected to an input terminal for the first input signal, and the input of the second inverter is disconnected to an input terminal for the second input signal.

The control circuit of the present invention may comprise:

a first switch connected between a supply terminal for the reference signal and the input of the first inverter;

a second switch connected between the supply terminal for the reference signal and the input of the second inverter;

a third switch connected between the input terminal for the first input signal and the input of the first inverter;

a fourth switch connected between the input terminal for the second input signal and the input of the second inverter;

a fifth switch connected between the control terminal of the first transistor of the second conductivity type and the output of the first inverter;

a sixth switch connected between the control terminal of the second transistor of the second conductivity type and the output of the second inverter;

a seventh switch connected between the output of the first inverter and the input of the second inverter;

an eighth switch connected between the output of the second inverter and the input of the first inverter;

a ninth switch connected between a supply terminal for the bias signal and the control terminal of the first transistor of the first conductivity type; and a tenth switch connected between the supply terminal for the bias signal and the control terminal of the second transistor of the first conductivity type.

In the present invention, it may be so arranged that, during a first period, the first switch, the second switch, the fifth switch, the sixth switch, the ninth switch, and the tenth switch are turned on, the third switch and the fourth switch are turned off, and the seventh switch and the eighth switch are turned off, thereby constituting the first connection state;

during a second period, the first switch, the second switch, the fifth switch, the sixth switch, the ninth switch, and the tenth switch are turned off, the third switch and the fourth switch are turned on, and the seventh switch and the eighth switches are kept off, thereby constituting the second connection state; and during a third period, the first switch, the second switch, the fifth switch, the sixth switch, the ninth switch, and the tenth switch are kept off, the third switch and the fourth switch are turned off, the seventh switch and the eighth switch are turned on, thereby constituting the third connection state.

In the present invention, the second input signal may be a complementary signal of the first input signal. Further, in the present invention, at least one of the first input signal and the second input signal may be a digital data signal, and the reference signal may be set within a range of an amplitude of the digital data signal.

In the present invention, the control over switching may be exercised so that the first through three connection states are sequentially assumed by each of a plurality of data sequentially input to at least one of the first input signal and the second input signal.

Alternatively, in the present invention, the control over switching may be exercised so that the first through three connection states are sequentially assumed by initial data among a plurality of data sequentially input to at least one of the first input signal and the second input signal, and for a subsequent predetermined number of the sequentially data, the first connection state is omitted, and the second and third states are assumed by the subsequent predetermined number of the sequentially data.

The amplifier may comprise MOS transistors and/or thin film transistors.

The amplifier according to the present invention may be applied to a sense amplifier, a flip-flop type voltage comparator, a latch circuit, or the like.

The meritorious effects of the present invention are summarized as follows.

According to the present invention, the reference signal is applied to the respective inputs of the two inverters that form the flip flop, and a predetermined current flows through each inverter, in advance. In this state correction value for characteristic variations in the transistors is detected, and stored in each capacitance. Then, a flip-flop operation is performed using the correction value of each capacitance. A highly reliable operation that does not depend on the characteristic variations in the transistors is thereby made possible, and a high-speed operation is thereby also made possible at the same time.

According to the present invention, the correction values for the characteristic variations in the transistors that have been detected once can also be used for the plurality of data supplied as the input signal. Accordingly, the correction value can also be used for a data signal of a high frequency.

BRIEF DESCRIPTION OF THE DRAWINGS

FIGS. 6A and 6B are diagrams showing control over the switches in the first mode of the present invention;

FIGS. 12A and 12B are diagrams showing control over the switches in the first mode of the present invention;

PREFERRED MODES OF THE INVENTION

Figure 1:
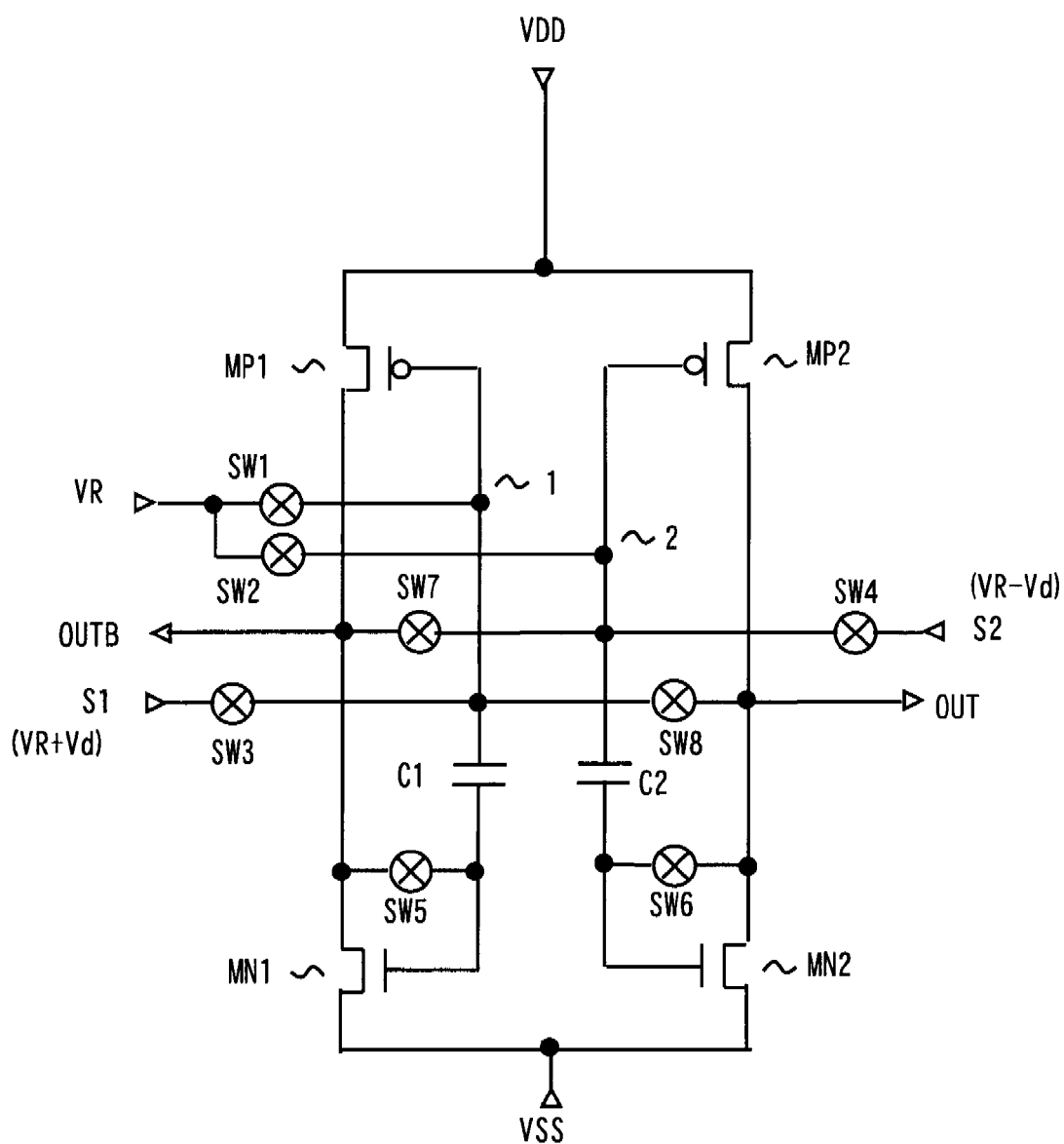
FIG. 1 is a diagram showing a configuration of a first mode of the present invention.

In order to describe modes of the present invention described above in further detail, a description will be given below with reference to appended drawings. Referring to FIG. 1, in first and second inverters that form a flip-flop in a signal amplifier according to an example of the present invention, a control terminal of at least one transistor (MN1) of first transistor pair (MP1, MN1) that constitutes the first inverter is connected through first capacitance (C1) to input (1) of the first inverter, and a control terminal of at least one transistor (MN2) of second transistor pair (MP2, MN2) that constitutes the second inverter is connected through second capacitance (C2) to input (2) of the second inverter. At a time of resetting, with the inputs (1, 2) of the first and second inverters not mutually cross-connected to outputs (OUT, OUTB) of the second and first inverters, the inputs (1, 2) of the first and second inverters receive a reference signal (VR) in common. Each of one transistors (MN1, MN2) of the first and second transistor pairs is diode-connected. Potential differences between the reference signal (VR) and the respective control terminals of the one transistors (MN1, MN2) are stored in the first and second capacitances (C1, C2), respectively. At a time of signal input, the inputs (1, 2) of the first and second inverters are disconnected from the reference signal (VR). The diode connections of the ones transistors (MN1, MN2) are released. The inputs (1, 2) of the first and second inverters receive first and second signals (S1, S2), respectively. Then, the inputs (1, 2) of the first and second inverters are mutually cross-connected to the outputs (OUT, OUTB) of the second and first inverters, thereby forming the flip-flop. In the present invention, the control terminals of the other transistors (MP1, MP2) may be the inputs (1, 2) of the first and second inverters, respectively.

Figure 7:
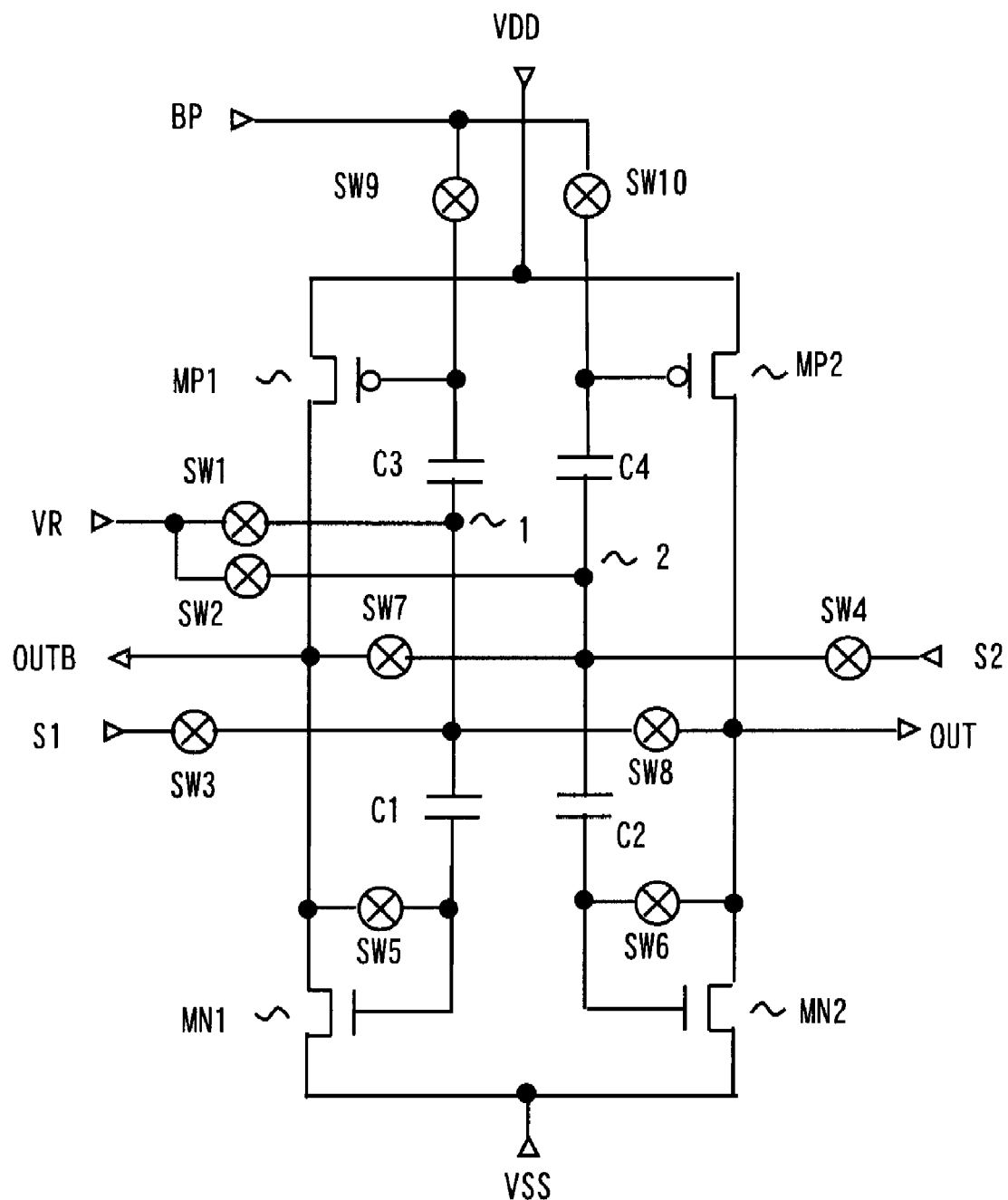
FIG. 7 is a diagram showing a configuration of a second mode of the present invention.

Alternatively, referring to FIG. 7, in the first and second inverters that form the flip-flop in a signal amplifier according to an example of the present invention, a control terminal of at least the one transistor (MN1) of the first transistor pair (MP1, MN1) that constitutes the first inverter may be connected through the first capacitance (C1) to the input (1) of the first inverter, and a control terminal of at least one transistor (MN2) of second transistor pair (MP2, MN2) that constitutes the second inverter may be connected through second capacitance (C2) to input (2) of the second inverter. At a time of resetting, with the inputs (1, 2) of the first and second inverters not mutually cross-connected to the outputs (OUT, OUTB) of the second and first inverters, the inputs (1, 2) of the first and second inverters may receive the reference signal (VR) in common. Each of the one transistors (MN1, MN2) of the first and second transistor pairs may be diode-connected. The other transistors (MP1, MP2) may receive first and second bias signals (BP, BP), respectively. Potential differences between the reference signal (VR) and the respective control terminals of the one transistors (MN1, MN2) may be stored in the first and second capacitances (C1, C2), respectively. At a time of signal input, the inputs (1, 2) of the first and second inverters may be disconnected from the reference signal (VR). The control terminals of the other transistors (MP1, MP2) may be disconnected from the first and second bias signals (BP, BP). The diode connections of the one transistors (MN1, MN2) may be released. The inputs (1, 2) of the first and second inverters may receive the first and second signals (S1, S2), respectively. Then, the inputs (1, 2) of the first and second inverters may be mutually cross-connected to the outputs (OUT, OUTB) of the second and first inverters, thereby forming the flip-flop. The present invention may include a third capacitance (C3) connected between an input (1) of the first inverter and a control terminal of the other transistor (MP1), and a fourth capacitance (C4) connected between an input (2) of the second inverter and a control terminal of the other transistor (MP2). At the time of resetting, voltage differences between the reference signal (VR) and the respective control terminals of the other transistors (MP1, MP2) may be stored in the third and fourth capacitances (C3, C4), respectively. In the present invention, when the inputs (1, 2) of the first and second inverters are mutually cross-connected to the outputs (OUT, OUTB) of the second and first inverters to form the flip-flop, the inputs (1, 2) of the first and second inverters may be disconnected from the first and second input signals (S1, S2).

More specifically, referring to FIG. 1, the signal amplifier includes a first transistor (MP1) of a first conductivity type and a first transistor (MN1) of a second conductivity type that constitute the first inverter, connected in series between a first power supply (VDD) and a second power supply (VSS); a second transistor (MP2) of the first conductivity type and a second transistor (MN2) of the second conductivity type that constitute a second inverter, connected in series with the first and second power supplies; a first capacitance (C1) connected between control terminals of the first transistor (MP1) of the first conductivity type and the first transistor (MN1) of the second conductivity type; and a second capacitance (C2) connected between control terminals of the second transistor (MP2) of the first conductivity type and the second transistor (MN2) of the second conductivity type. The control terminals of the first and second transistors of the first conductivity type (MP1, MP2) are set as inputs (nodes) (1, 2) of the first and second inverters, respectively.

This circuit assumes first through third connection states that will be described below. That is, in the first connection state (during a first period), an output (node OUTB) of the first inverter (constituted from the transistors MP1 and MN1) is disconnected with the input (node) (2) of the second inverter (constituted from the transistors MP2 and MN2), and an output (node OUT) of the second inverter is disconnected with the input (node) (1) of the first inverter. A reference signal (VR) is applied in common to the inputs (1, 2) of the first and second inverters, and the first and second transistors (MN1 and MN2) of the second conductivity type are diode-connected, respectively.

In the second connection state (during a second period), the diode connections of the first and second transistors (MN1 and MN2) of the second conductivity type are released. Then, a first input signal (S1) is supplied to the input (1) of the first inverter, while a second input signal (S2) is supplied to the input (2) of the second inverter.

In the third connection state (during a third period), the output (OUTB) of the first inverter (constituted from the transistors MP1 and MN1) is connected to the input (2) of the second inverter (constituted from the transistors MP2 and MN2), and the output (OUT) of the second inverter (constituted from the transistors MP2 and MN2) is connected to the input (1) of the first inverter (constituted from the transistors MP1 and MN1). The present invention may be so configured that in the third connection state, the inputs (1, 2) of the first and second inverters are disconnected to input terminals for the first and second input signals (S1, S2).

Alternatively, referring to FIG. 7, the signal amplifier according to an example of the present invention includes the first transistor (MP1) of the first conductivity type and the first transistor (MN1) of the second conductivity type that constitute the first inverter, connected in series between the first power supply and the second power supply, the second transistor (MP2) of the first conductivity type and the second transistor (MN2) of the second conductivity type that constitute the second inverter, connected in series with the first and second power supplies, the first and third capacitances (C1 and C3) connected in series between the control terminal of the first transistor (MN1) of the second conductivity type and the control terminal of the first transistor (MP1) of the first conductivity type; and the second and fourth capacitances (C2 and C4) connected between the control terminal of the second transistor (MN2) of the second conductivity type and the control terminal of the second transistor (MP2) of the first conductivity type. A connecting node between the first and third capacitances (C1 and C3) is set as the input (1) of the first inverter, while a connecting node between the second and fourth capacitances (C2 and C4) is set as the input (2) of the second inverter.

This circuit assumes first through third connection states that will be described below. In the first connection state (during a first period), the output (node OUTB) of the first inverter and the input (2) of the second inverter are disconnected, and the output (node OUT) of the second inverter and the input (1) of the first inverter are disconnected. The bias signal (BP) is applied in common to the control terminals of the first and second transistors (MP1 and MP2) of the first conductivity type. A reference signal (VR) is applied in common to the inputs (1, 2) of the first and second inverters, and the first and second transistors (MN1 and MN2) of the second conductivity type are both diode-connected, respectively.

In the second connection state (during a second period), the diode connections of the first and second transistors (MN1 and MN2) of the second conductivity type are released. Then, the first input signal (S1) is supplied to the input (1) of the first inverter, while the second input signal (S2) is supplied to the input (2) of the second inverter.

In the third connection state (during a third period), the output (OUTB) of the first inverter (constituted from the transistors MP1 and MN1) is connected to the input (2) of the second inverter (constituted from the transistors MP2 and MN2), and the output (OUT) of the second inverter (constituted from the transistors MP2 and MN2) is connected to the input (node) (1) of the first inverter (constituted from the transistors MP1 and MN1). In the present invention, in the third connection state, the input (node) (1) of the first inverter is disconnected to an input terminal for the first input signal (S1), and the input (node) (2) of the second inverter is disconnected to an input terminal for the second input signal (S2).

In the present invention, the first connection state is set as a reset period. Difference voltages between the reference signal (VR) and voltages at the respective control terminals (nodes) of the first and second transistors (MN1 and MN2) of the second conductivity type are stored in the first capacitance and second capacitance (C1 and C2), respectively, and a flip-flop operation according to the input signals (S1, S2) resulting from the following second and third connection states, which does not depend on variations in devices is made possible. In the present invention, the second input signal (S2) may be a complementary signal of the first input signal (S1).

In the present invention, at least one of the first and second input signals (S1, S2) is set to a digital data signal, and the reference signal (typically, voltage) is set within a range of an amplitude of the digital data signal. In the present example, the first conductivity type and the second conductivity type may be formed as a P channel and an N channel, respectively. Alternatively, the first conductivity type and the second conductivity type may be formed as the N channel and the P channel, respectively.

In the present invention, control-over switching may be exercised so that, the first through third connection states (first through third periods) may be sequentially assumed by each of a plurality of data successively input to at least one of the first and second input terminals for the first and second input signals (S1, S2).

Alternatively, in the present example, the control-over switching may be exercised so that for a plurality of data successively input to at least one of the first and second input terminals (S1, S2), the first through third connection states (first through three periods) may be sequentially assumed by initial data, and the second and third states (second and third periods) may be assumed by each of the subsequent data.

In addition, in the present invention, it is preferable that the number of power supplies is small. Appended drawings (FIGS. 1 and 7) show examples with the number of the power supplies being three or four (VDD, VSS, VR, and BP). However, when addition of the power supplies is possible, an example in which addition of the bias signal has been performed is possible. The following examples (FIGS. 23 and 24) are modifications of FIGS. 1 and 7.

Figure 23:
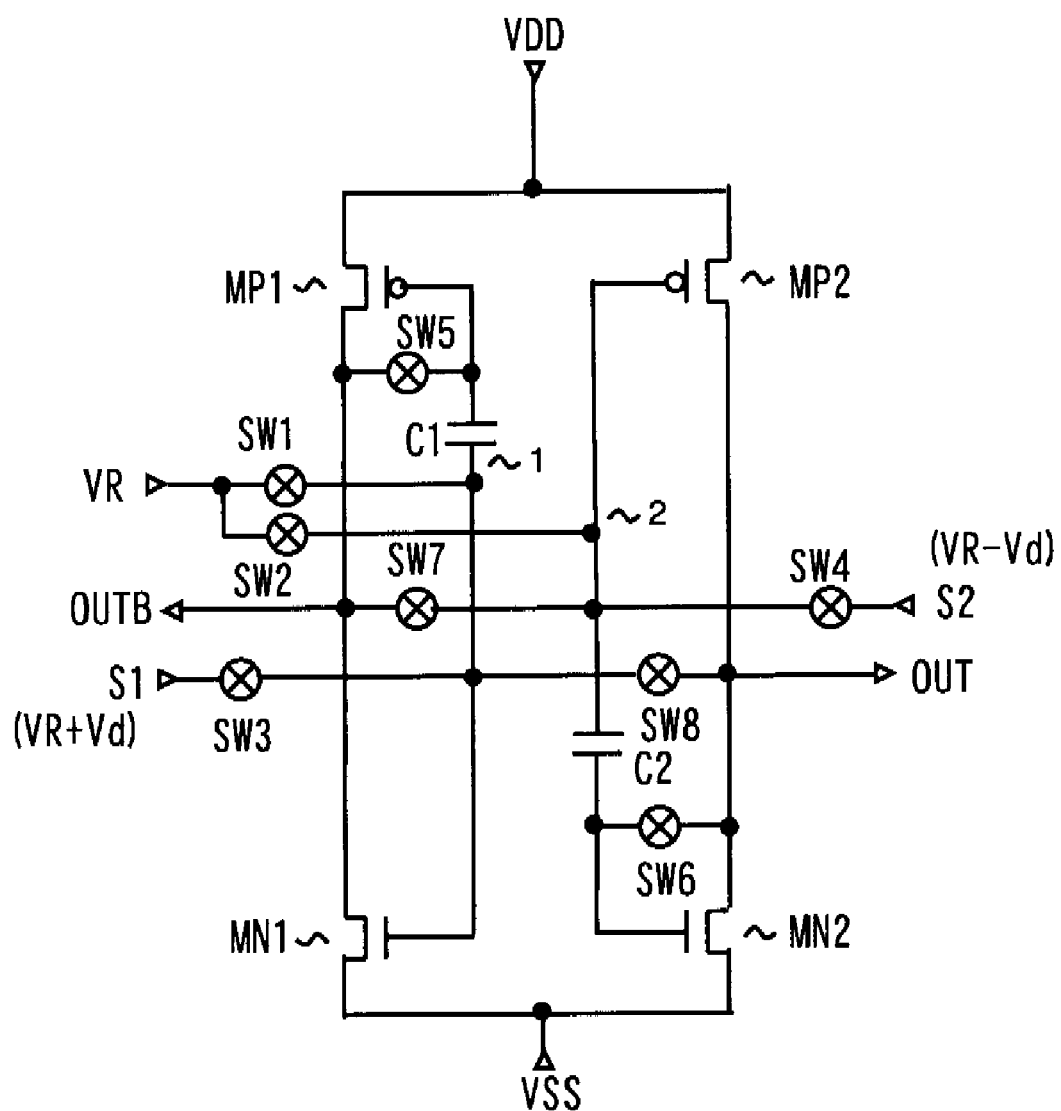
FIG. 23 is a diagram showing a configuration of a third mode of the present invention.

Referring to FIG. 23, according to a third mode in the first and second inverters that constitute a flip-flop in a signal amplifier in the present invention, a control terminal of at least one transistor (constituted from a first transistor (MP1) of a first conductivity type) of a first transistor pair (constituted from a first transistor (MP1) of the first conductivity type and a first transistor (MN1) of the second conductivity type) constituting the first inverter is connected through first capacitance (C1) to input (1) of the first inverter; and a control terminal of at least one transistor (constituted from a second transistor (MN2) of the second conductivity type) of a second transistor pair (constituted from a second transistor (MP2) of the first conductivity type and a second transistor (MN2) of the second conductivity type) constituting the second inverter is connected through second capacitance (C2) to input (2) of the second inverter. At a time of resetting, the inputs (1, 2) of the first and second inverters receive the reference signal (VR) in common, with the inputs (1, 2) of the first and second inverters not mutually cross-connected to the outputs (OUT, OUTB) of the second and first inverters. The one transistors (constituted from a first transistor (MP1) of the first conductivity type and a second transistor (MN2) of the second conductivity type) of the first and second transistor pairs are diode-connected, respectively. Voltage differences between the reference signal (VR) and the respective control terminals of the one transistors (constituted from a first transistor (MP1) of the first conductivity type and a second transistor (MN2) of the second conductivity type) are stored in the first capacitance (C1) and second capacitance (C2), respectively. At a time of signal input, the inputs (1, 2) of the first and second inverters are disconnected from the reference signal (VR), the diode connections of the one transistors (constituted from a first transistor (MP1) of the first conductivity type and a second transistor (MN2) of the second conductivity type) are released, the inputs (1, 2) of the first and second inverters receive the first and second input signals (S1, S2), respectively, and then the inputs (1, 2) of the first and second inverters are mutually cross-connected to the outputs (OUT, OUTB) of the second and first inverters, thereby forming the flip-flop.

In the present invention, the control terminals of the other transistors (constituted from the first transistor (MN1) of the second conductivity type and the second transistor (MP2) of the first conductivity type) may be set as the inputs (1, 2) of the first and second inverters.

Figure 24:
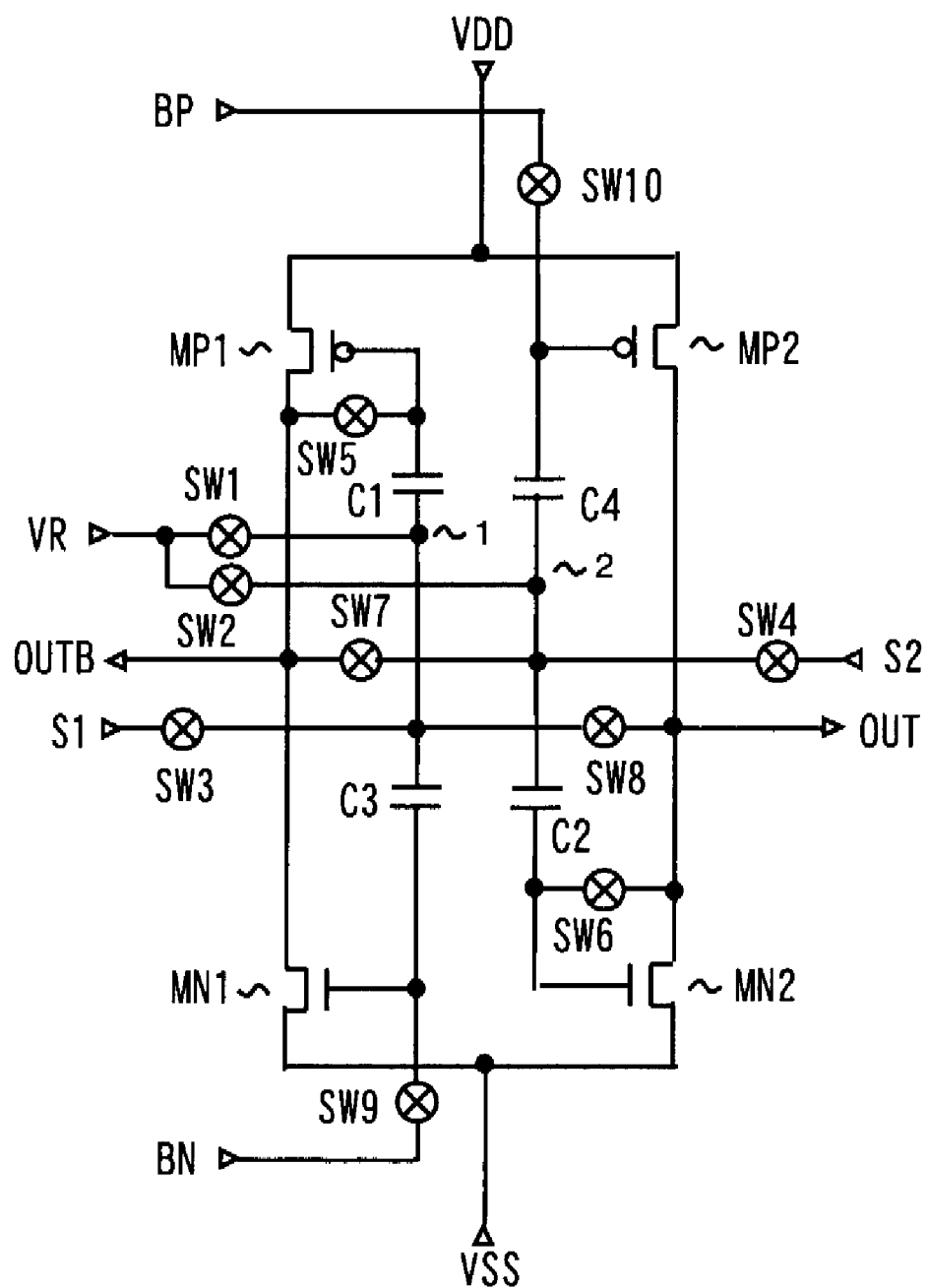
FIG. 24 is a diagram showing a configuration of a fourth mode of the present invention.

Alternatively, referring to FIG. 24, in a signal amplifier according to a fourth mode of the present invention may be formulated as follows: A control terminal of at least one transistor (constituted from a first transistor (MP1) of the first conductivity type) of a first transistor pair (constituted from a first transistor (MP1) of the first conductivity type and a first transistor (MN1) of the second conductivity type) constituting the first inverter may be connected, through first capacitance (C1), to input (1) of the first inverter; and a control terminal of at least one transistor (constituted from a second transistor (MN2) of the second conductivity type) of a second transistor pair (constituted from a second transistor (MP2) of the first conductivity type and a second transistor (MN2) of the second conductivity type) constituting the second inverter may be connected, through second capacitance (C2), to input (2) of the second inverter. At a time of resetting, the inputs (1, 2) of the first and second inverters may receive the reference signal (VR) in common, with the inputs (1, 2) of the first and second inverters not mutually cross-connected to the outputs (OUT, OUTB) of the second and first inverters. The one transistors (constituted from the first transistor (MP1) of the first conductivity type and the second transistor (MN2) of the second conductivity type) of the first and second transistor pairs may be diode-connected, respectively. Respective control terminals of the other transistors (constituted from the first transistor (MN1) of the second conductivity type and the second transistor (MP2) of the first conductivity type) may receive the first and second bias signals (BN, BP), respectively. Voltage differences between the reference signal (VR) and the respective control terminals of the one transistors (constituted from the first transistor (MP1) of the first conductivity type and the second transistor (MN2) of the second conductivity type) may be stored in the first and second capacitances (C1, C2), respectively. At a time of signal input, the inputs (1, 2) of the first and second inverters may be disconnected from the reference signal (VR). The control terminals of the other transistors (constituted from the first transistor (MN1) of the second conductivity type and the second transistor (MP2) of the first conductivity type) may be disconnected from the first and second bias signals (BN, BP). The diode connections of the one transistors (constituted from the first transistor (MP1) of the first conductivity type and the second transistor (MN2) of the second conductivity type) may be released. The inputs (1, 2) of the first and second inverters may receive the first and second input signals (S1, S2), respectively, and then the inputs (1, 2) of the first and second inverters may be mutually cross-connected to the outputs (OUT, OUTB) of the second and first inverters, thereby forming the flip-flop.

The present invention may further include a third capacitance (C3) connected between an input (1) of the first inverter and a control terminal of the other transistor (the first transistor (MN1) of the second conductivity type) and a fourth capacitance (C4) connected between an input (2) of the second inverter and a control terminal of the other transistor (the second transistor (MP2) of the first conductivity type). At a time of resetting, voltage differences between the reference signal (VR) and the respective control terminals of the other transistors (constituted from the first transistor (MN1) of the second conductivity type and the second transistor (MP2) of the first conductivity type) may be stored in the third and fourth capacitances (C3, C4), respectively.

In the present invention, when the flip-flop is formed by mutually cross-connecting the inputs (1, 2) of the first and second inverters and the outputs (OUT, OUTB) of the second and first inverters, the inputs (1, 2) of the first and second inverters may be disconnected from the first and second input signals (S1, S2), respectively. The following description will be given, in connection with examples having a small (or less) number of the power supplies.

Figure 3:
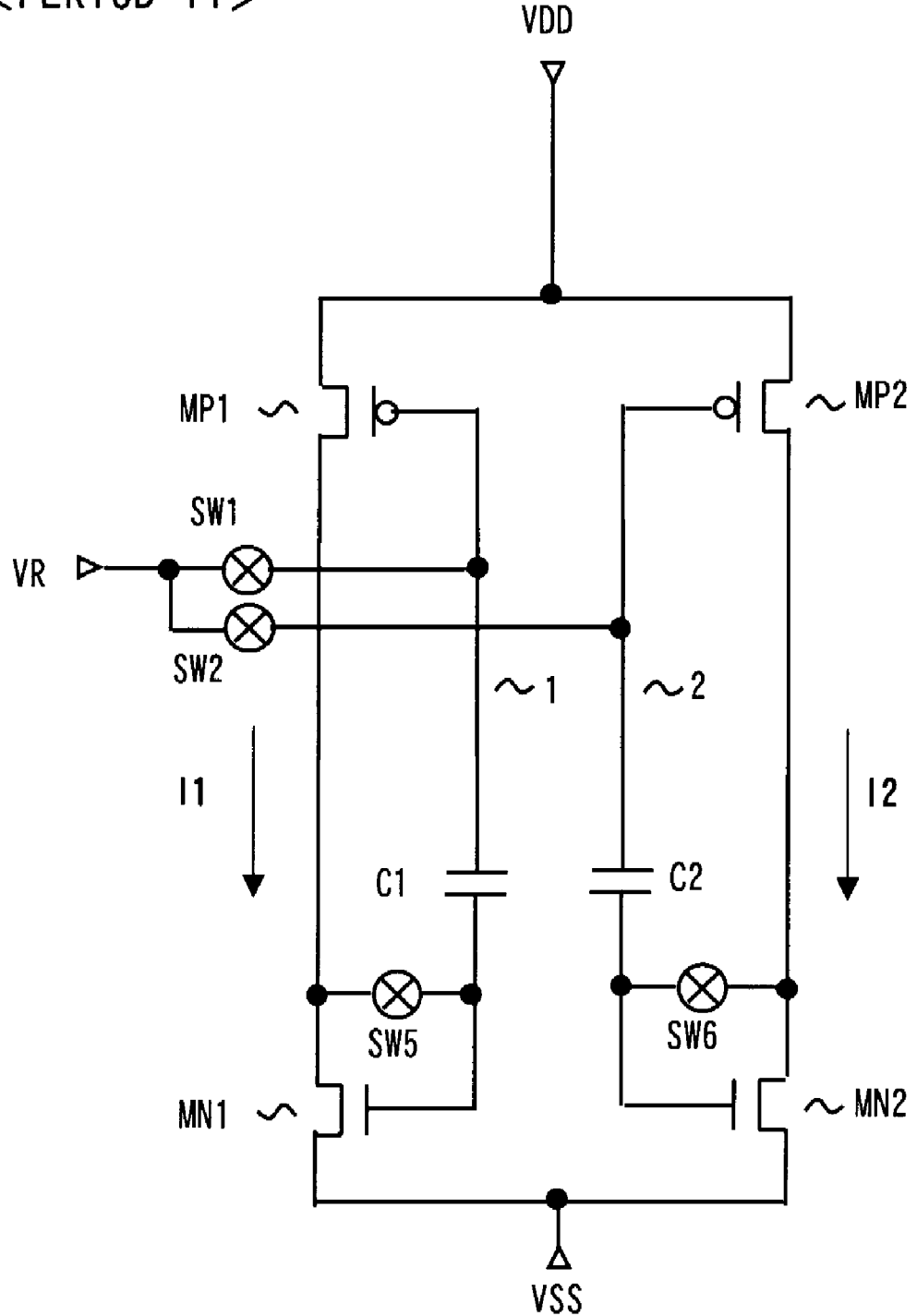
FIG. 3 is a diagram showing a connecting configuration during a period T1 in the first mode of the present invention.
Figure 4:
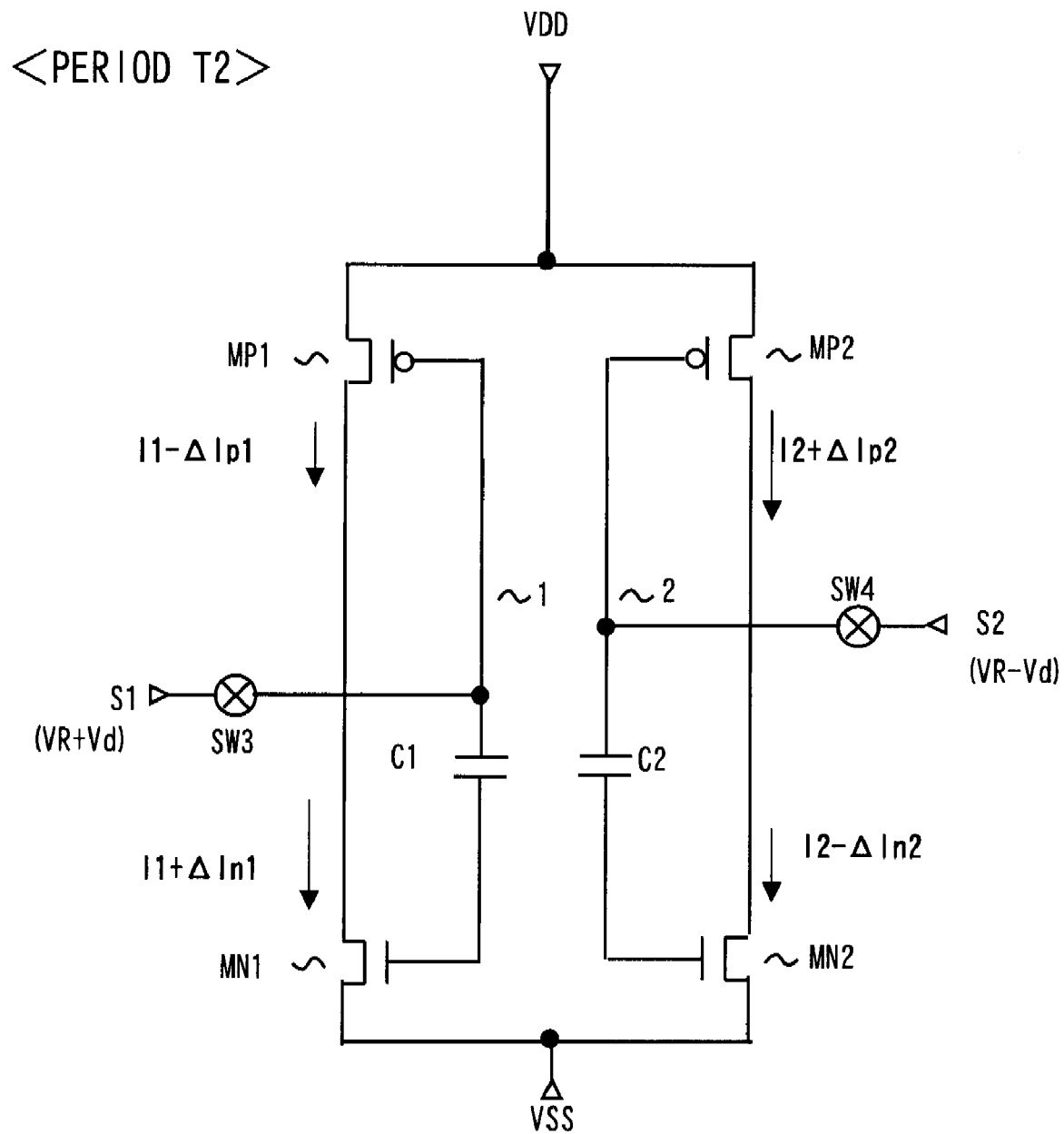
FIG. 4 is a diagram showing a connecting configuration during a period T2 in the first mode of the present invention.

Further, the signal amplifier of FIG. 3, can be controlled similarly as the control of each switch of FIG. 1, and the signal amplifier of FIG. 4 can be controlled similarly as the control of each switch of FIG. 7. Therefore, the detailed explanation of FIGS. 23 and 24 is omitted here as it will be readily understood based on the detailed disclosure of FIG. 1 and 7 set out in the following.

EXAMPLES

FIG. 1 is a diagram showing a configuration of a first example of the present invention. Referring to FIG. 1, a digital signal amplifier according to this example includes PMOS transistors MP1 and MP2 with sources thereof connected in common to a power supply VDD and NMOS transistors MN1 and MN2 with sources thereof connected in common to a power supply VSS. The PMOS transistor MP2 and the NMOS transistor MN2 form a second inverter. Respective drains of the PMOS transistor MP2 and the NMOS transistor MN2 are connected in common to form a common drain (node) which constitutes an output terminal of the second inverter as well as an output terminal OUT of the digital signal amplifier. The PMOS transistor MP1 and the NMOS transistor MN1 form the first inverter. Respective drains of the PMOS transistor MP1 and the NMOS transistor MN1 are connected in common, to form a common drain (node) which constitutes an output terminal OUTB of the first inverter and the output terminal OUTB that outputs a complementary signal for the output terminal OUT of the digital signal amplifier. The digital signal amplifier according to this example includes a capacitance C1 connected between gates of the NMOS transistor MN1 and the PMOS transistor MP1 and a capacitance C2 connected between gates of the NMOS transistor MN2 and the PMOS transistor MP2. The gates of the PMOS transistors MP1 and MP2 are set as input terminals 1 and 2 of the first and second inverters, respectively.

The digital signal amplifier according to this example further includes switches SW1, SW2, SW3, SWS4, SW5, SW6, SW7, and SW8. The switch SW1 is connected between a terminal for supplying a reference signal VR and the input terminal 1 of the first inverter (the gate of the PMOS transistors MP1), and the switch SW2 is connected between the terminal for supplying the reference signal VR and an input terminal 2 of the second inverter (the gate of the PMOS transistor MP2). The switch SW3 is connected between an input terminal for the input signal S1 and an input terminal 1 of the fist inverter, and the switch SW4 is connected between an input terminal for the input signal S2 and the input terminal 2 of the second inverter. The switch SW5 is connected between a gate of the NMOS transistor MN1 and an output terminal OUTB (constituted from the common drain node of the PMOS transistor MP1 and the NMOS transistor MN1). The switch SW6 is connected between a gate of the NMOS transistor MN2 and an output terminal OUT (constituted from a common drain node of the PMOS transistor MP2 and the NMOS transistor MN2). The switch SW7 is connected between the output terminal OUTB and the input terminal 2 of the second inverter. The switch SW8 is connected between the output terminal OUT and the input terminal 1 of the first inverter.

This example can be applied to a flip-flop type voltage comparator circuit that inputs the digital data signal as at least one of the input signals S1 and S2, or a sense amplifier circuit (refer to FIG. 13) connected to a bit line pair, and is configured to cancel an offset caused by manufacturing variations in transistors. The voltage of the reference signal VR is set within the range of the amplitude of the digital data signal, and preferably, the voltage of the reference signal VR is set as a center value of the amplitude of the digital data signal.

The PMOS transistor MP1 and the NMOS transistor MN1 constitute a CMOS inverter, while the PMOS transistor MP2 and the NMOS transistor MN2 constitute a CMOS inverter, and the input terminals and output terminals of the CMOS inverters are mutually cross-connected, thereby forming the flip-flop.

Figure 2:
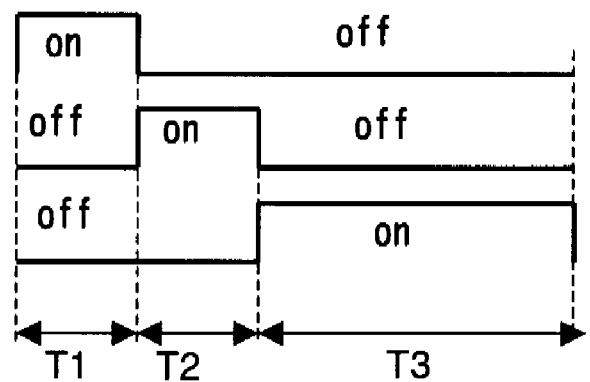
FIG. 2 is a diagram showing controls over switches in the first mode of the present invention.
Figure 5:
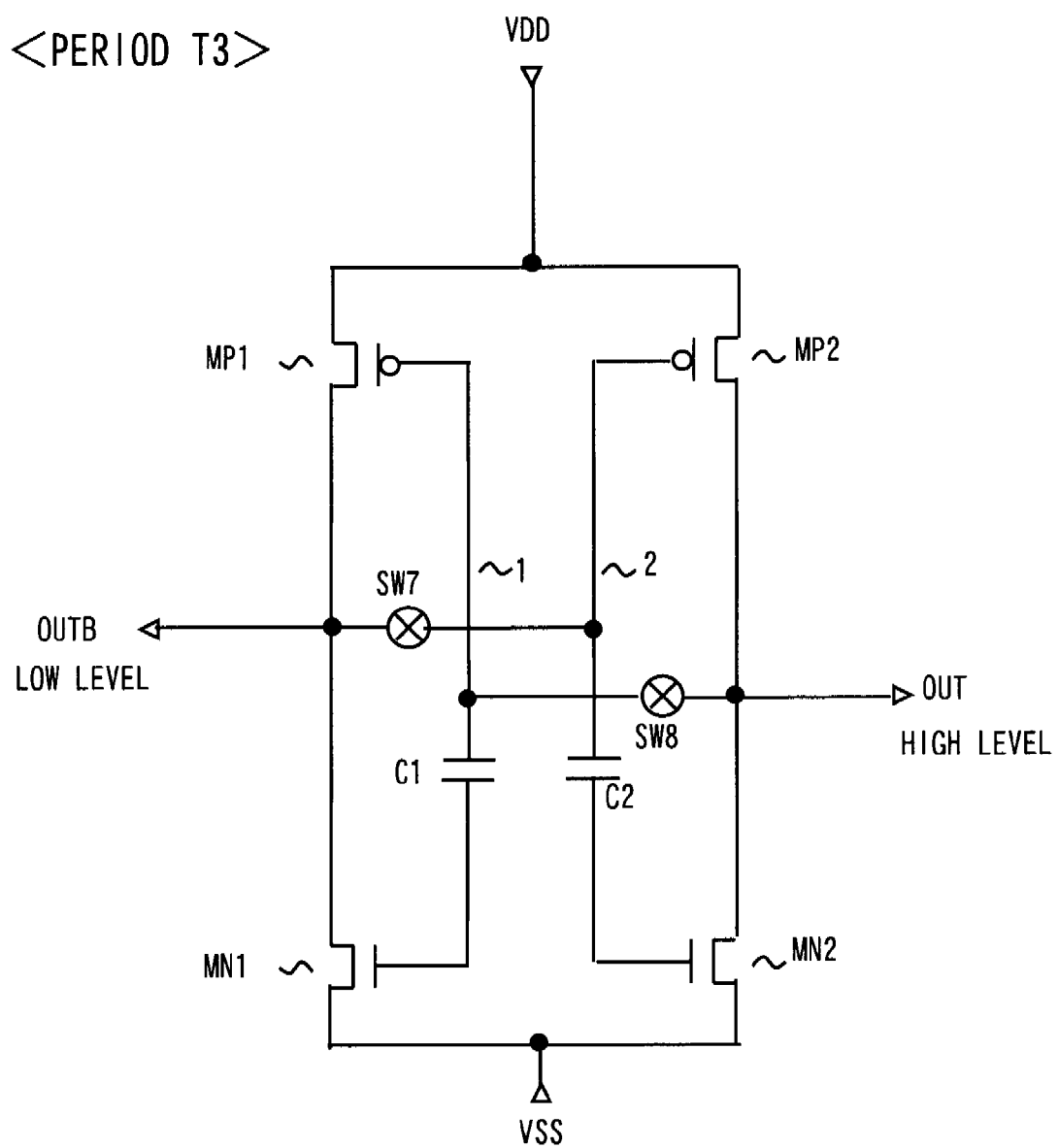
FIG. 5 is a diagram showing a connecting configuration during a period T3 in the first mode of the present invention.

FIG. 2 is a timing diagram showing an operation of this example. FIGS. 3, 4, and 5 are diagrams showing circuit connecting configurations during periods T1, T2, and T3 in FIG. 2, respectively. The operation when a data value (VR+Vd) using the voltage of the reference signal VR as the center value thereof and a complementary value (VR−Vd) of the data value (VR+Vd) are input as the input signals S1 and S2, respectively will be described below.

Referring to FIGS. 2 and 3, during the period T1, the switches SW1, SW2, SW5, and SW6 are turned on, while the switches SW3 and SW4 are turned off, and the switches SW7 and SW8 are turned off. In this case, as shown in FIG. 3, the reference signal VR that also functions as the bias signal is applied to the gate (terminal 1) of the PMOS transistor MP1 and the gate (terminal 2) of the PMOS transistor MP2 that constitute the input terminals of the first and second inverters, respectively. Both of the NMOS transistors MN1 and MN2 are diode-connected, respectively. A current I1 flows through the PMOS transistor MP1 and the NMOS transistor MN1 that constitute the first inverter, while a current I2 flows through the PMOS transistor MP2 and the NMOS transistor MN2 that constitute the second inverter. The reference signal VR is applied to the gate of the NMOS transistor MN1 through the capacitance C1 and to the gate of the NMOS transistor MN2 through the capacitance C2. A potential difference between a gate voltage of the NMOS transistor MN1 and the reference signal VR is stored in the capacitance C1, and a potential difference between a gate voltage of the NMOS transistor MN2 and the reference signal VR is stored in the capacitance C2. In other words, in the period TI, when the reference signal VR is input, the potential difference that causes the same current (I1) to flow through the transistors MN1 and MP1 of the first inverter is stored in the capacitance C1, and the potential difference that causes the same current (I2) to flow through the transistors MN2 and MP2 of the second inverter is stored in the capacitance C2. Further, even when a variation in the characteristics occurs in one of the transistors MN1, MP1, MN2, and MP2, a condition that allows the same current to flow through the pair of the transistors in each inverter is formed with reliability. The period T1 is set to a reset period for properly performing operations in periods T2 and T3.

Next, referring to FIGS. 2 and 4, during the period T2, the switches SW1, SW2, SW5, and SW6 are turned off, the switches SW3 and SW4 are turned on, and the switches SW7 and SW8 are kept off.

In this case, the potential difference stored in each of the capacitances C1 and C2 is held in the same state as that during the period T1. Further, through the switches SW3 and SW4 in an on state, data (VR+Vd) of the input signal S1 and data (VR−Vd) of the input signal S2 are input to the input terminals (terminals 1 and 2) of the first and second inverters, respectively. Assume the voltage Vd is positive, for example, a gate-to-source voltage of the PMOS transistor MP1 in the first inverter is reduced, and a drain current (source-to-drain current) of the PMOS transistor MP1 is reduced to become (I1−ΔIp1). Then, a gate-to-source voltage of the NMOS transistor MN1 increases, and a drain current (drain-to-source current) of the NMOS transistor MN1 increases to become (I1+ΔIn1). The output (OUTB) of the first inverter (at the common drain node of the transistors MP1 and MN1) thereby greatly changes to a negative side (VSS side). On the other hand, a drain current (source-to-drain current) of the PMOS transistor MP2 in the second inverter increases to become (I2+ΔIp2). Then, a drain current (drain-to-source current) of the NMOS transistor MN2 is reduced to become (I2−ΔIn2). The output (OUT) of the second inverter (at the common drain of the transistors MP2 and MN2) thereby greatly changes to a positive side (VDD side).

Next, referring to FIGS. 2 and 5, during the period T3, the switches SW1, SW2, SW5 and SW6 are kept off, the switches SW3 and SW4 are turned off, and the switches SW7 and SW8 are turned on. The potential difference stored in each of the capacitances C1 and C2 is consecutively held as in the state during the period T1. As shown in FIG. 5, the output OUTB of the first inverter (constituted from the transistors MP1 and MN1) that has greatly changed to the negative side (VSS side) is connected to the input (terminal 2) of the second inverter (constituted from the MP2 and MN2) through the switch SW7 in the on state, and the output OUT of the second inverter (constituted from the transistors MP2 and MN2) that has greatly changed to the positive side (VDD side) is connected to the input (terminal 1) of the first inverter (constituted from the transistors MP1 and MN1) through the switch SW8 in the on state, thereby forming the flip-flop. The outputs OUT and OUTB that are complementary to each other so as to change to a HIGH (VDD) level and a LOW (VSS) level, respectively, resulting in a stabilized state.

As described above, in regard to the first inverter (constituted from the transistors MP1 and MN1) and the second inverter (constituted from the MP2 and MN2) in this example, in the initial period T1 of data output, when the reference signal VR is input, the potential difference that causes the same current (I1) to flow through the transistors MN1 and MP1 of the first inverter is stored in the capacitance C1, while the potential difference that causes the same current (I2) to flow through the transistors MN2 and MP2 of the second inverter is stored in the capacitance C2. Then, in the subsequent periods T2 and T3, a flip-flop operation according to the data signals (S1, S2) using the reference signal VR as the center value thereof, which does not depend on variations in transistor characteristics is made possible. Since the potential difference between the capacitances C1 and C2 is quickly settled (determined) by the predetermined currents (I1 and I2) in the period T1, the period T1 can be set to a sufficiently short time. In this example, either of the signals S1 and S2 can be used as an input of the data signal. In this case, the reference signal VR is used as the other input. This example as described above does not depend on variations in the devices of the flip-flop (constituted from the transistors MN1, MN2, MP1, and MP2). The digital signal amplifier in this example can also be applied to a receiver circuit of a latch amplification type, the sense amplifier for a memory, or the like as well as the flip-flop type voltage comparator.

Figure 13:
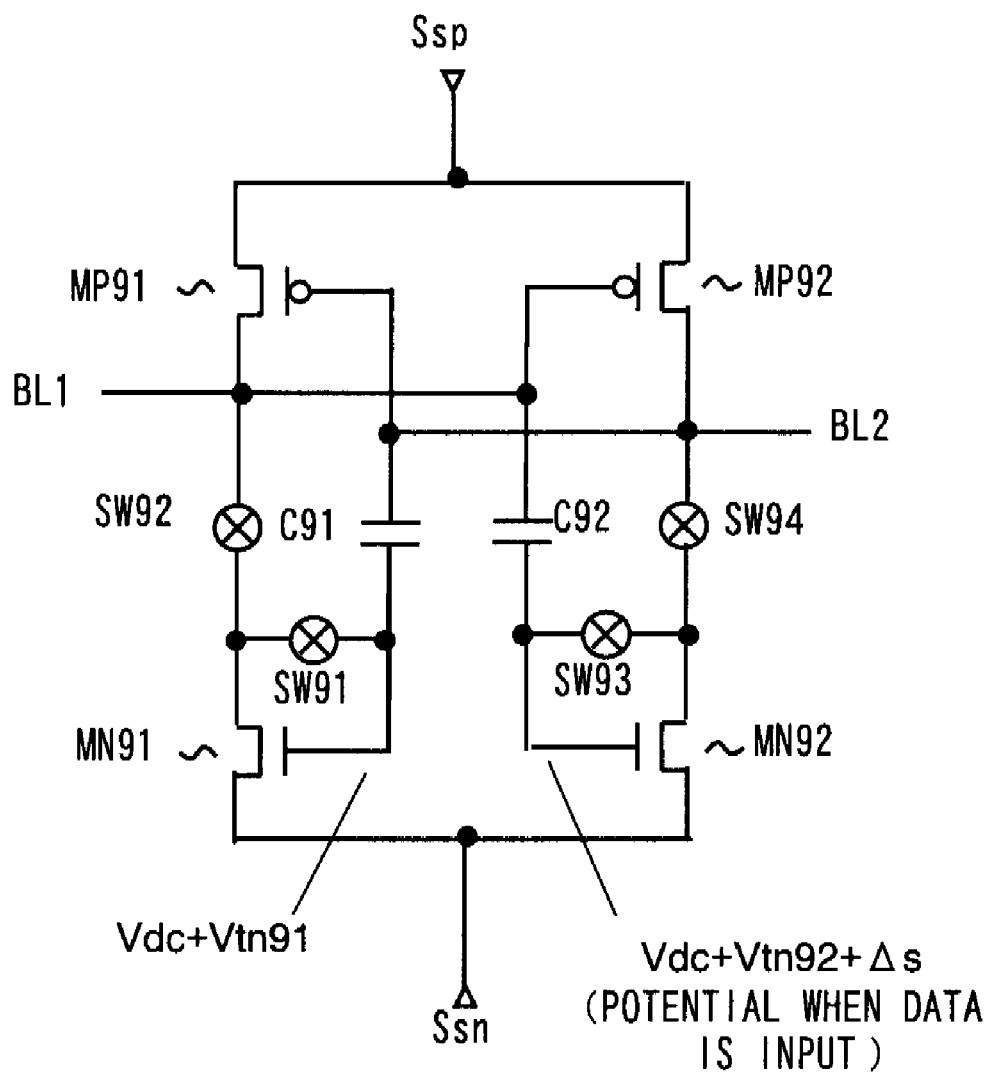
FIG. 13 is a diagram showing a configuration of a circuit described in Patent Document 1.
Figure 14:
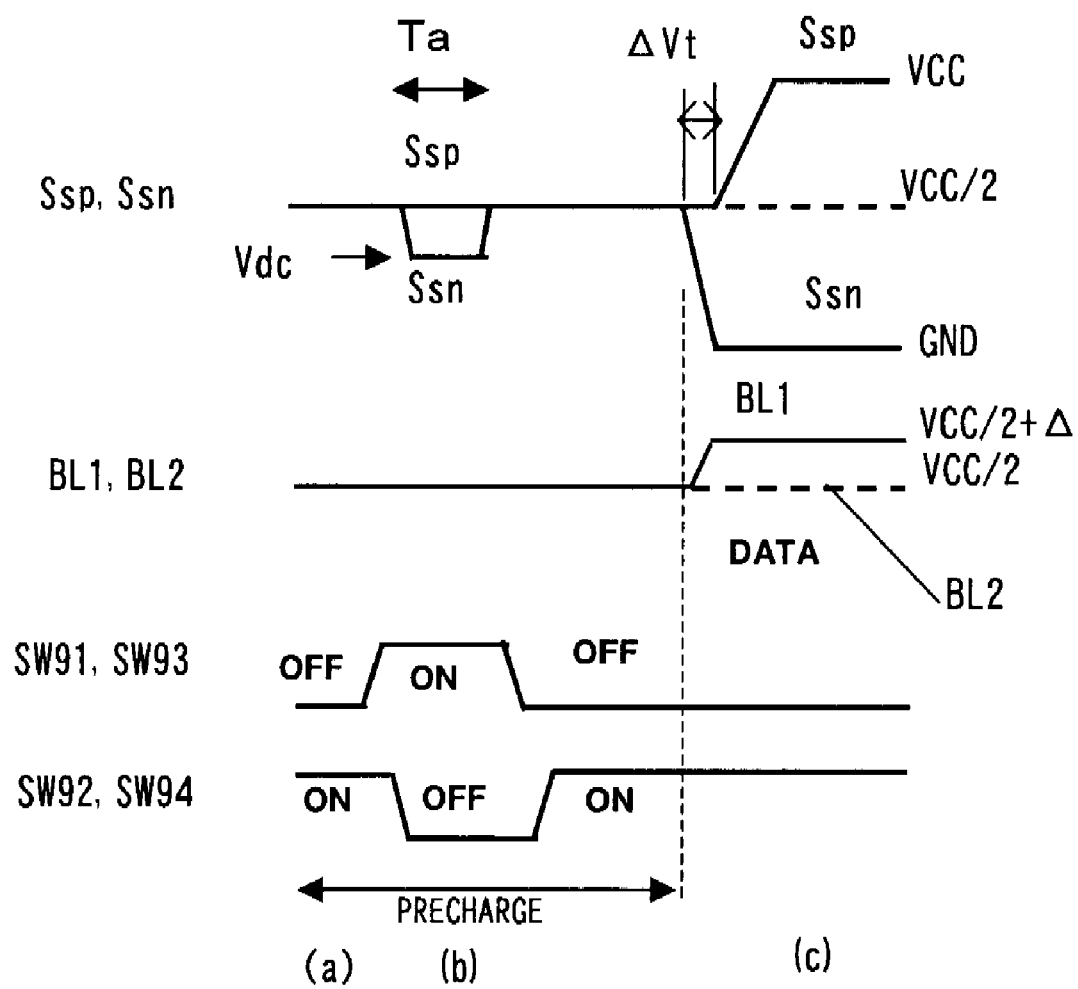
FIG. 14 is a diagram showing control over switches in FIG. 13.
Figure 15:
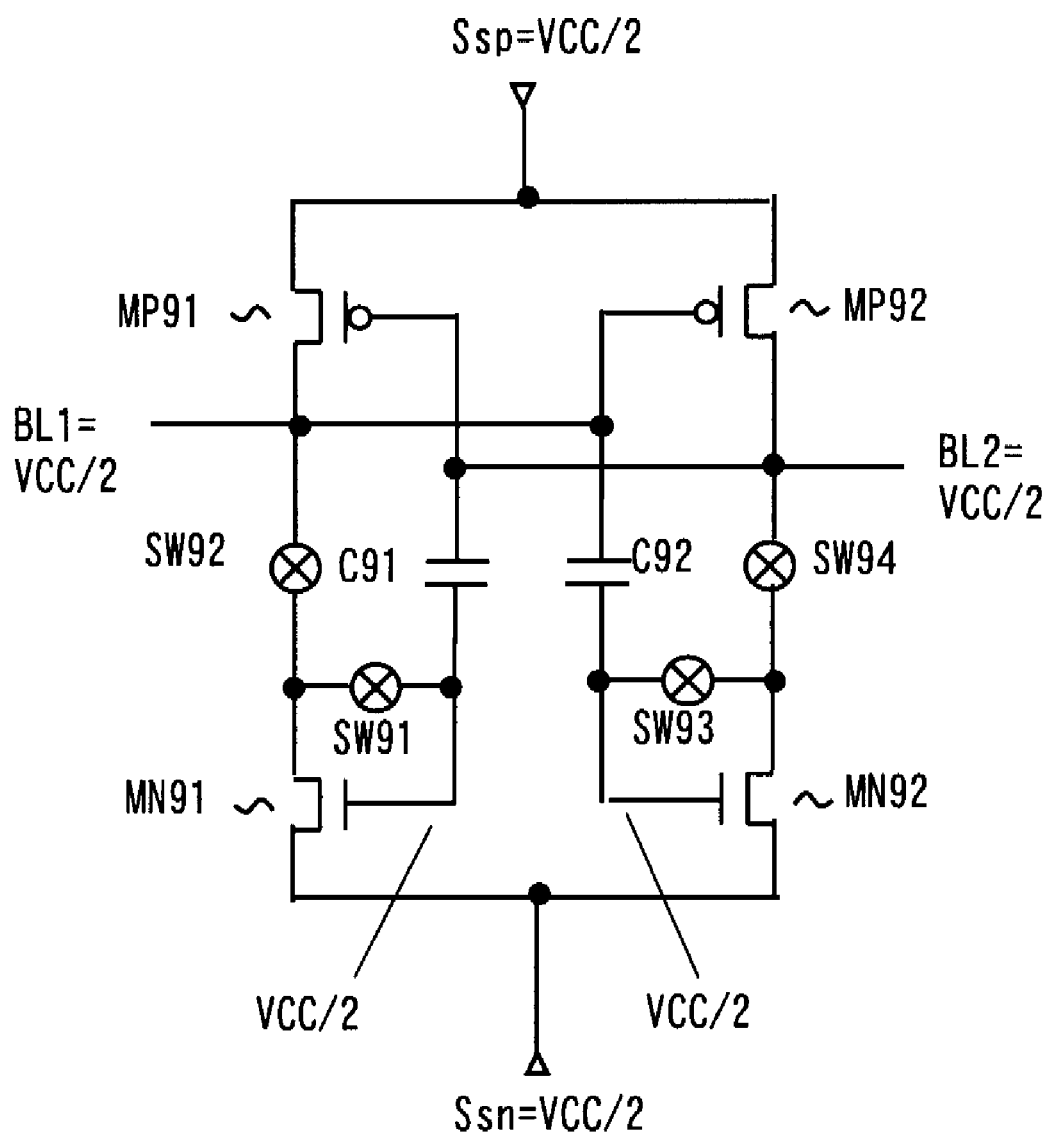
FIG. 15 is a diagram showing a connecting configuration in FIG. 13 at a first timing.
Figure 16:
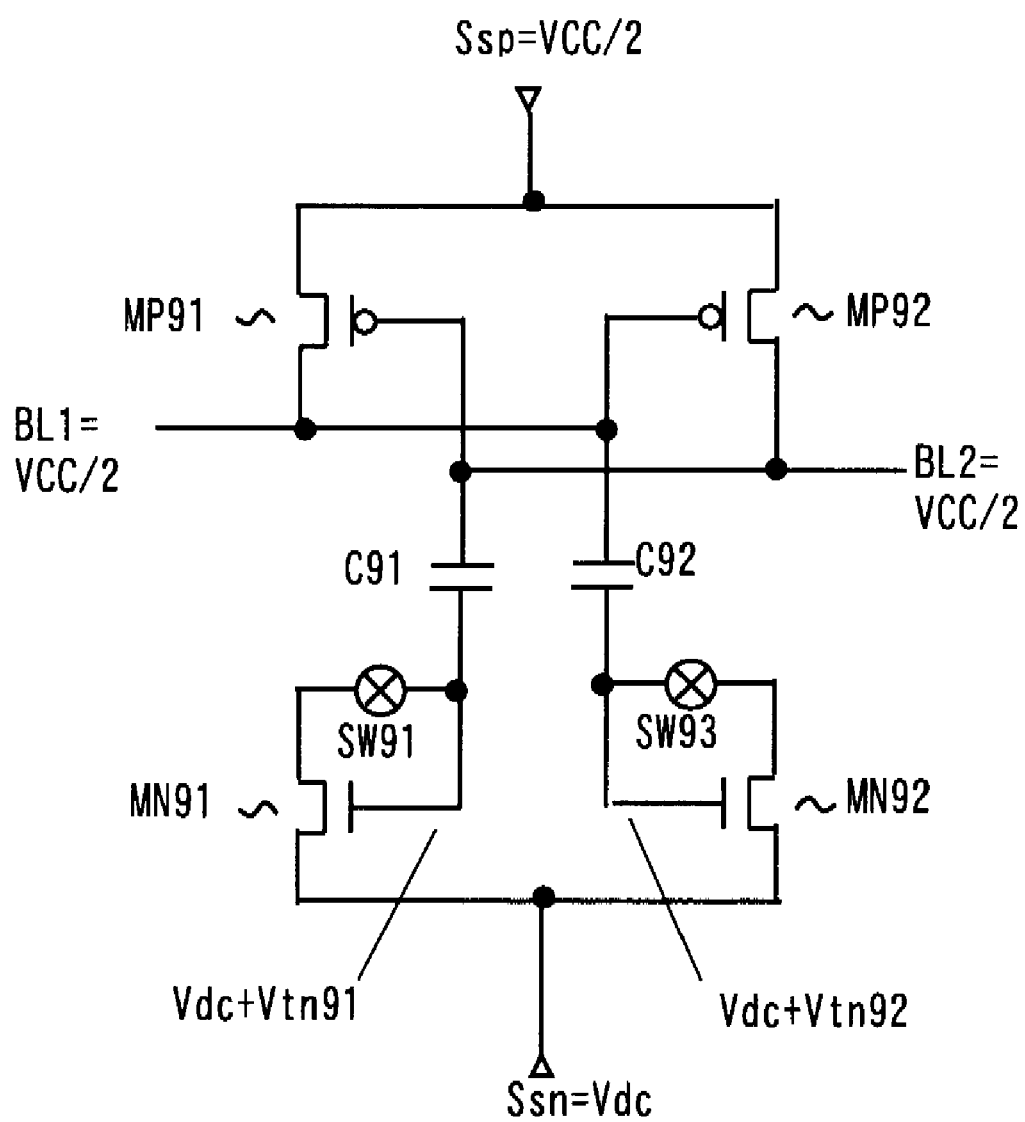
FIG. 16 is a diagram showing a connecting configuration in FIG. 13 at a second timing.
Figure 17:
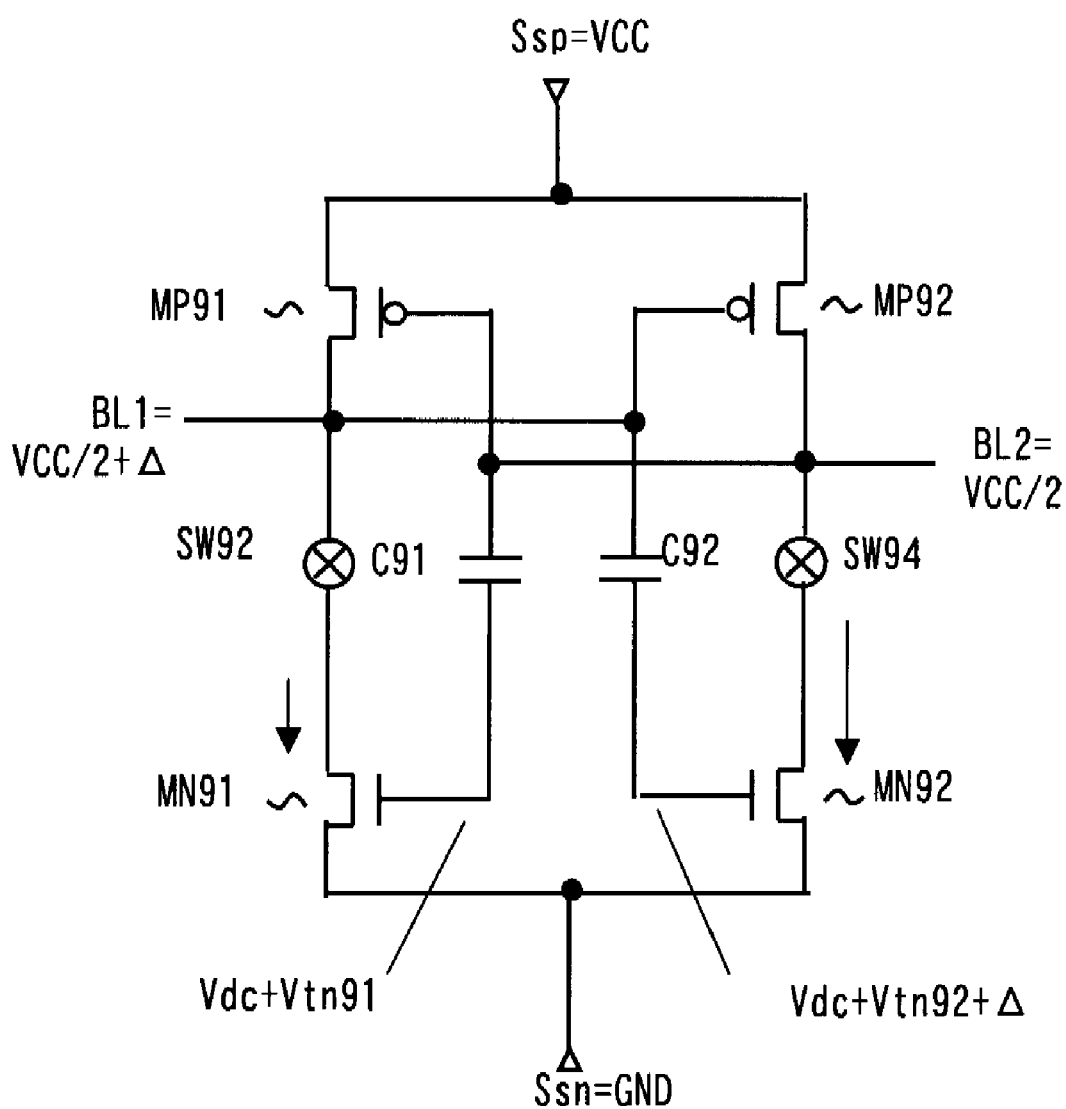
FIG. 17 is a diagram showing a connecting configuration in FIG. 13 at a third timing.

In this example, power supplies are set to VDD, VSS, and VR, and the number of the power supplies is reduced as compared with that in the circuit of FIG. 13. A higher speed operation is thereby made possible.

Figure 18:
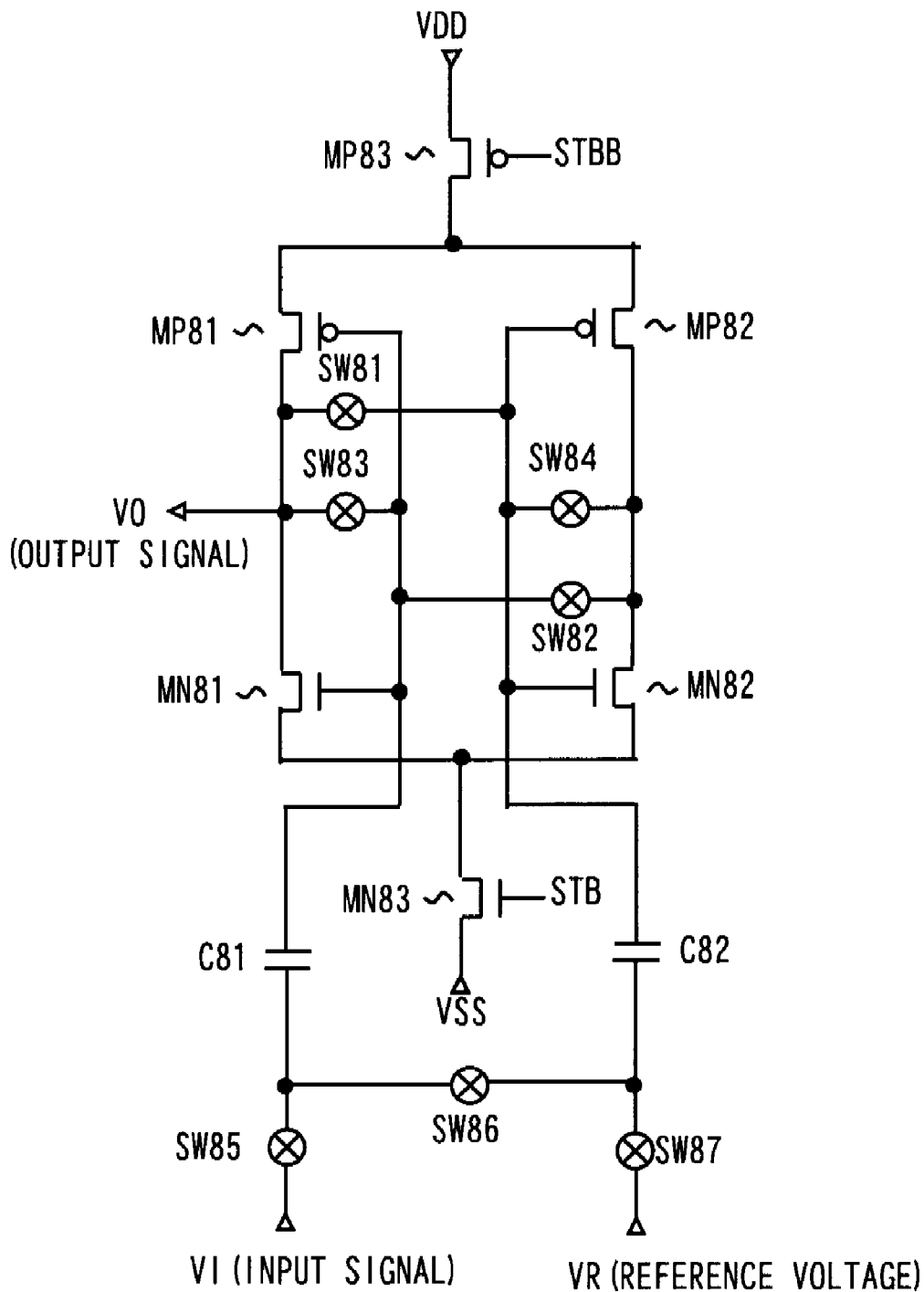
FIG. 18 is a diagram showing a configuration of a circuit described in Patent Document 2.
Figure 19:
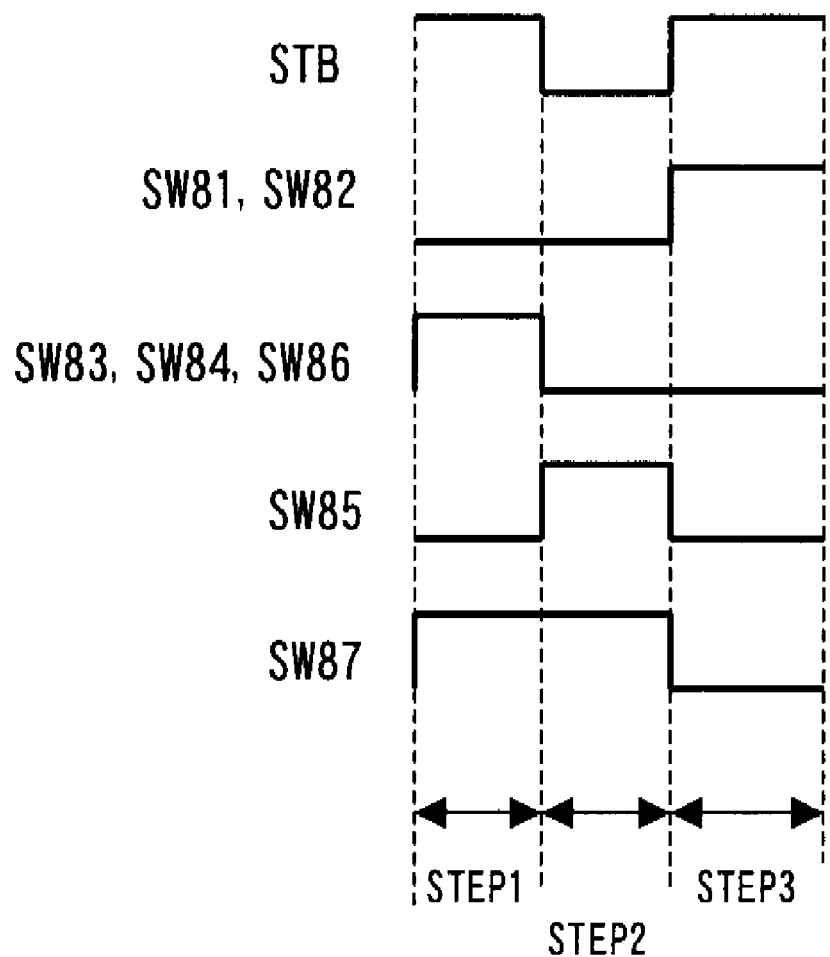
FIG. 19 is a diagram showing control over switches in FIG. 18.
Figure 20:
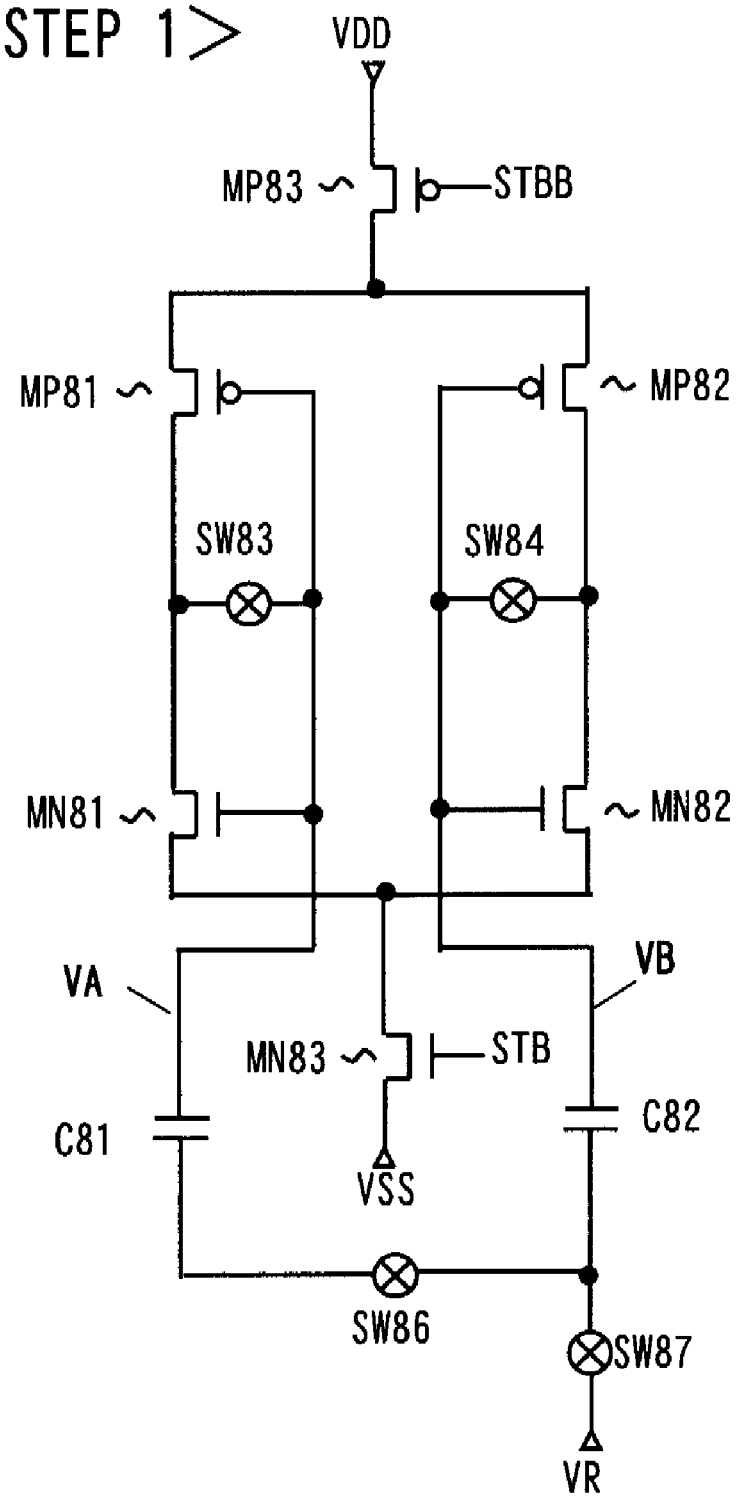
FIG. 20 is a diagram showing a connecting configuration in FIG. 18 in step 1.
Figure 21:
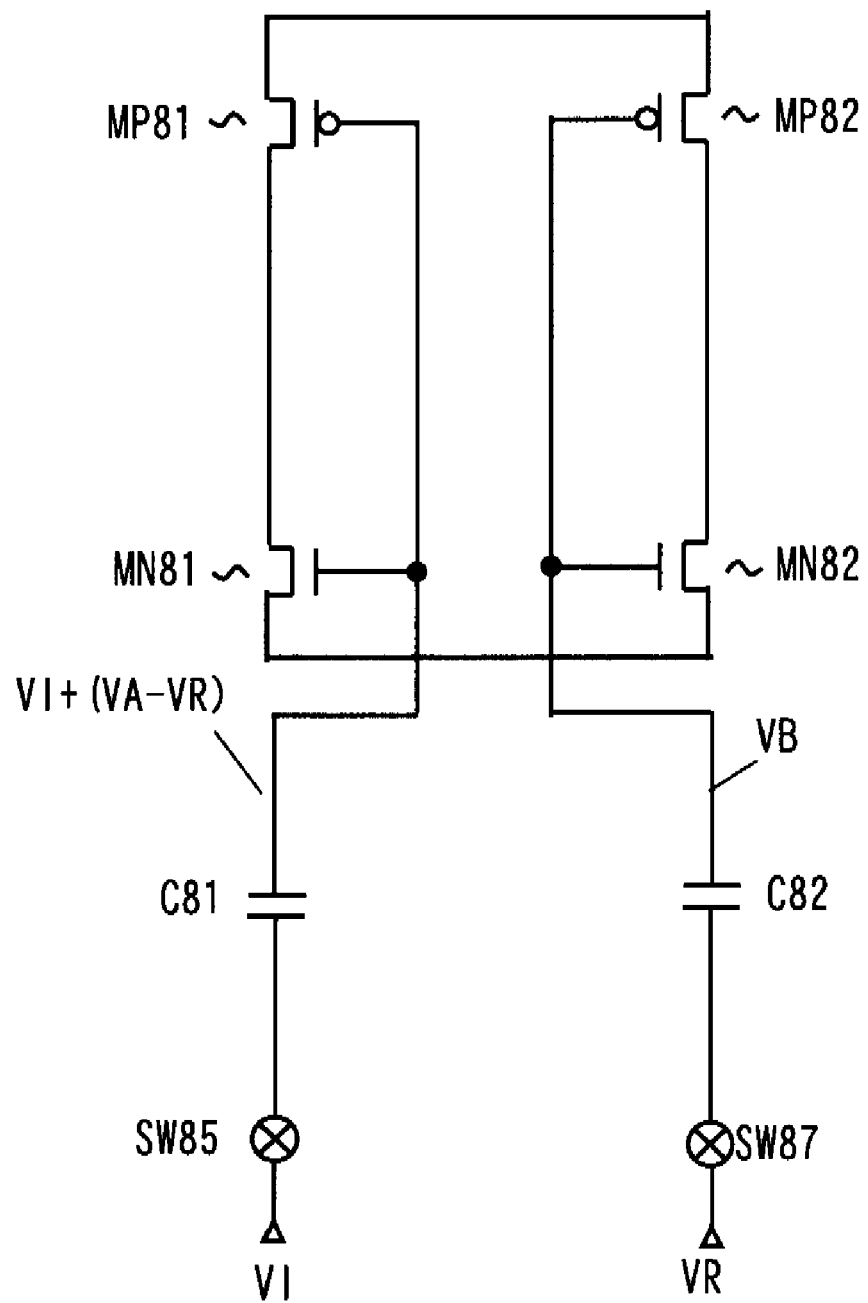
FIG. 21 is a diagram showing a connecting configuration in FIG. 18 in step 2.
Figure 22:
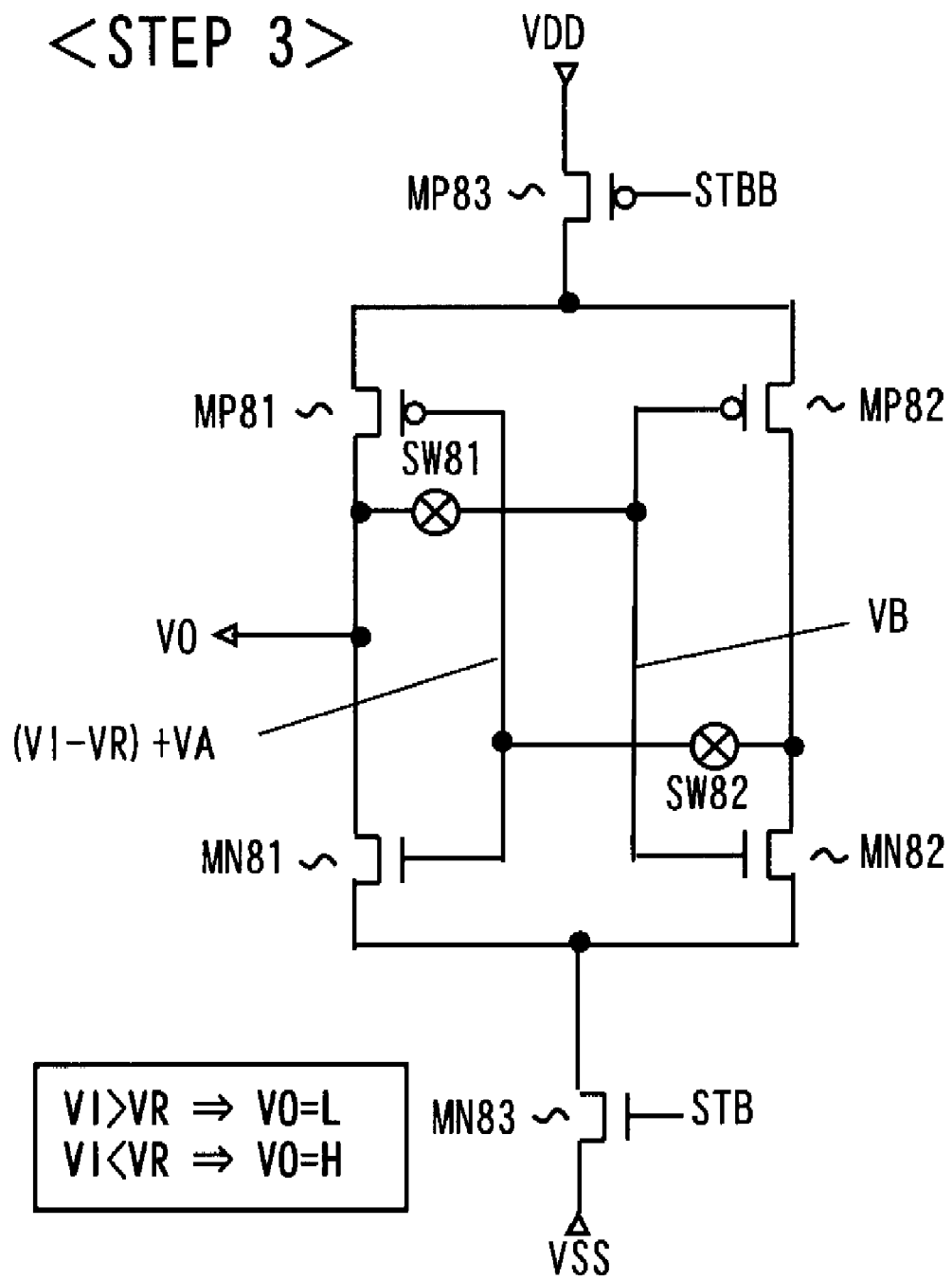
FIG. 22 is a diagram showing a connecting configuration in FIG. 18 in step 3.

In this example, for the gates of the NMOS transistors MN1 and MN2, capacitive coupling between the capacitance C1 and a parasitic capacitance of the switch SW5 and capacitive coupling between the capacitance C2 and a parasitic capacitance of the switch SW6 occur, respectively. However, the number of the elements associated with the capacitive couplings is smaller than those in the circuit shown in FIG. 18. Accordingly, the influence of the capacitive coupling is sufficiently small, and an operation on the data signal of even a smaller amplitude can be performed.

FIGS. 6A and 6B are diagrams explaining examples of control over the switches when data is sequentially input to at least one of the input signals S1 and S2 in this example. The control over the switches SW1 to SW8 from a first data period to a third data period and from an Nth data period to an (N+2)th data period is shown, in which N is an arbitrary positive number.

In an example shown in FIG. 6A, the control over the periods T1 to T3 is performed for each data.

In an example shown in FIG. 6B, the control over the periods T1 to T3 is performed during the first and Nth data periods. Then, during the subsequent data periods (at least during the second and third data periods and the (N+1)th and (N+2)th data periods), only the control over the periods T2 to T3 is performed. Electric charges held in the capacitances C1 and C2, respectively, during each period T1 of the first and Nth data periods are used in the subsequent data periods as well. The data signal of a high frequency can also be thereby accommodated.

Next, a second example of the present invention will be described. FIG. 7 is a diagram showing a configuration of the second example of the present invention. Referring to FIG. 7, a digital signal amplifier in this example has a configuration in which capacitances C3 and C4, switches SW9 and SW10, and a terminal for supplying a bias signal BP are added to the configuration of the circuit in the first example described with reference to FIG. 1. The capacitance C3 is connected between the gate of the PMOS transistor MP1 and the input terminal 1 of the first inverter (at a connecting point between the switches SW1 and SW3). The capacitance C4 is connected between the gate of the PMOS transistor MP2 and the input terminal 2 of the first inverter (at a connecting point between the switches SW2 and SW4). The switch SW9 is connected between the supply terminal for the bias signal BP and the gate of the PMOS transistor MP1. The switch SW10 is connected between the supply terminal for the bias signal BP and the gate of the PMOS transistor MP2. Since the configuration excluding these components is the same as that in FIG. 1, description of the configuration excluding these components will be omitted.

In the first example described before, the reference signal (bias signal) VR must have a voltage that causes the PMOS transistors MP1 and MP2 to be turned on. Accordingly, levels of the differential input signals (VR±Vd) are limited.

In the first example, the currents I1 and I2 are determined by a potential of the reference signal VR. Thus, current consumption and control over the operating speed depends on the reference signal VR.

This example constitutes an improved version of the first example described before. That is, the bias signal BP different from the reference signal VR is used to control currents that flow during the reset period independently of the reference signal VR, thereby allowing lower power. Further, respective voltage levels of the digital data signal and the reference signal VR can be set to arbitrary voltage levels that do not depend on threshold voltages of the transistors MP1, MN1, MP2, and MN2.

Figure 8:
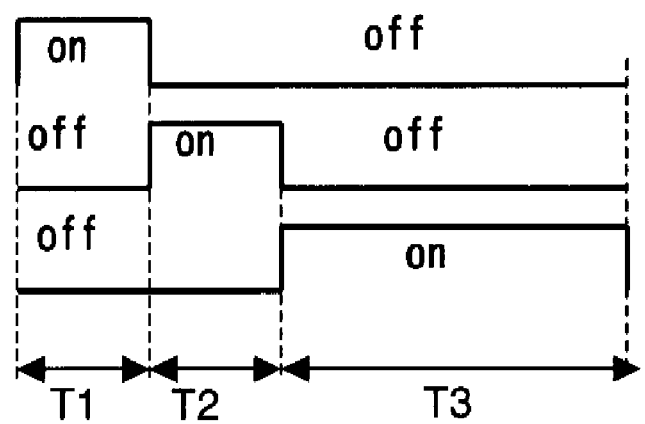
FIG. 8 is a diagram showing control over switches in the second mode of the present invention.
Figure 9:
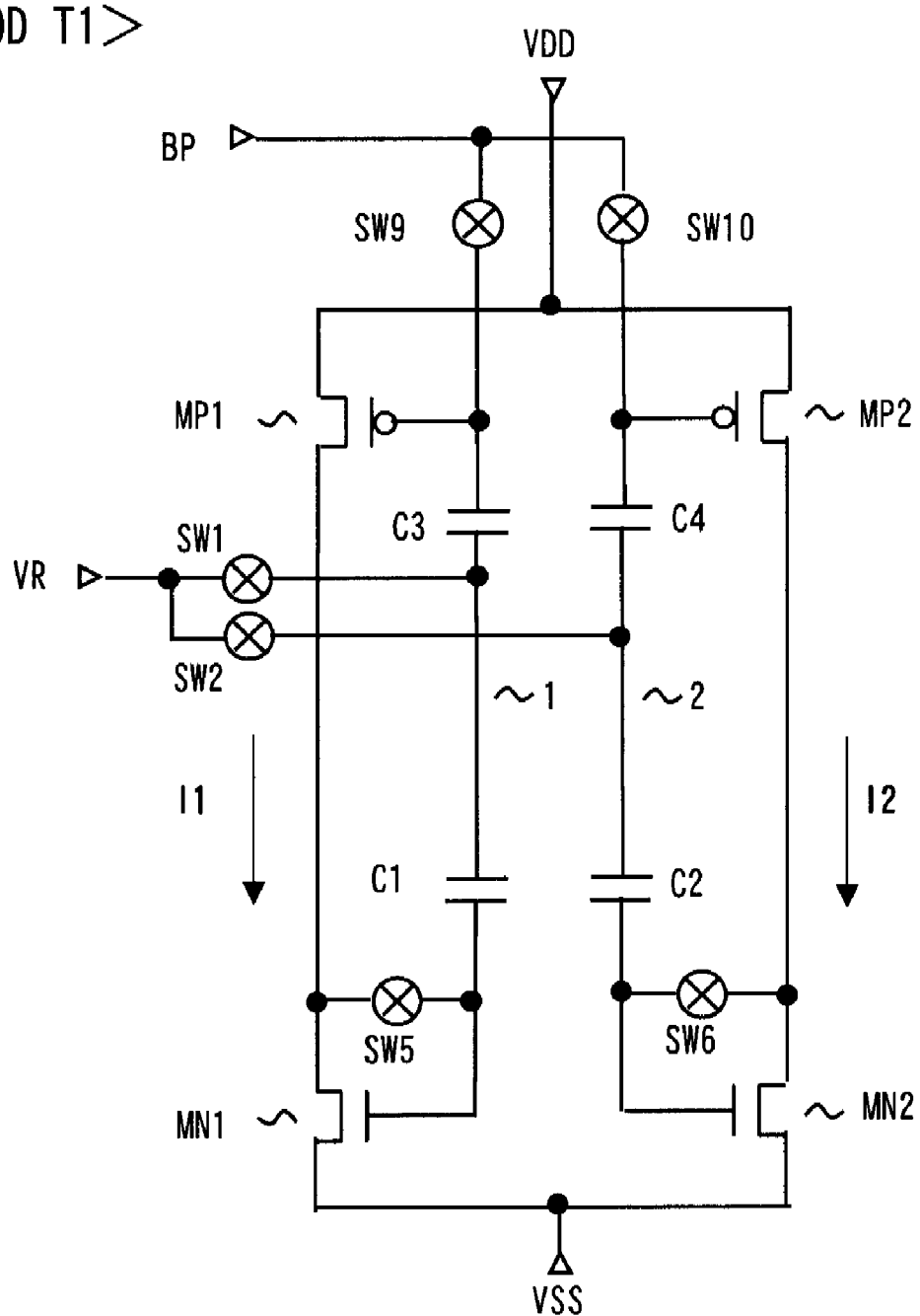
FIG. 9 is a diagram showing a connecting configuration during the period T1 in the second mode of the present invention.
Figure 10:
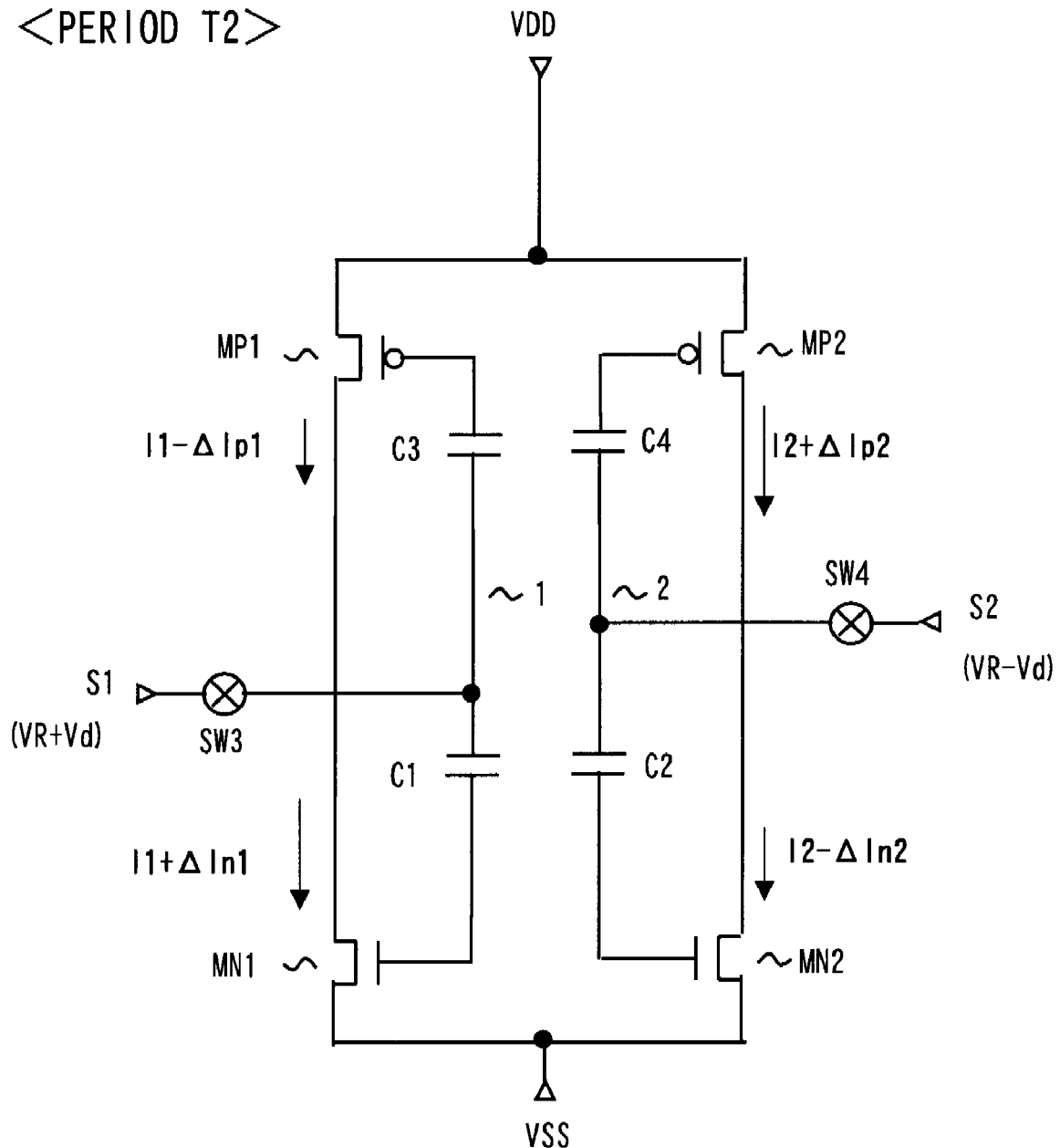
FIG. 10 is a diagram showing a connecting configuration during the period T2 in the second mode of the present invention.
Figure 11:
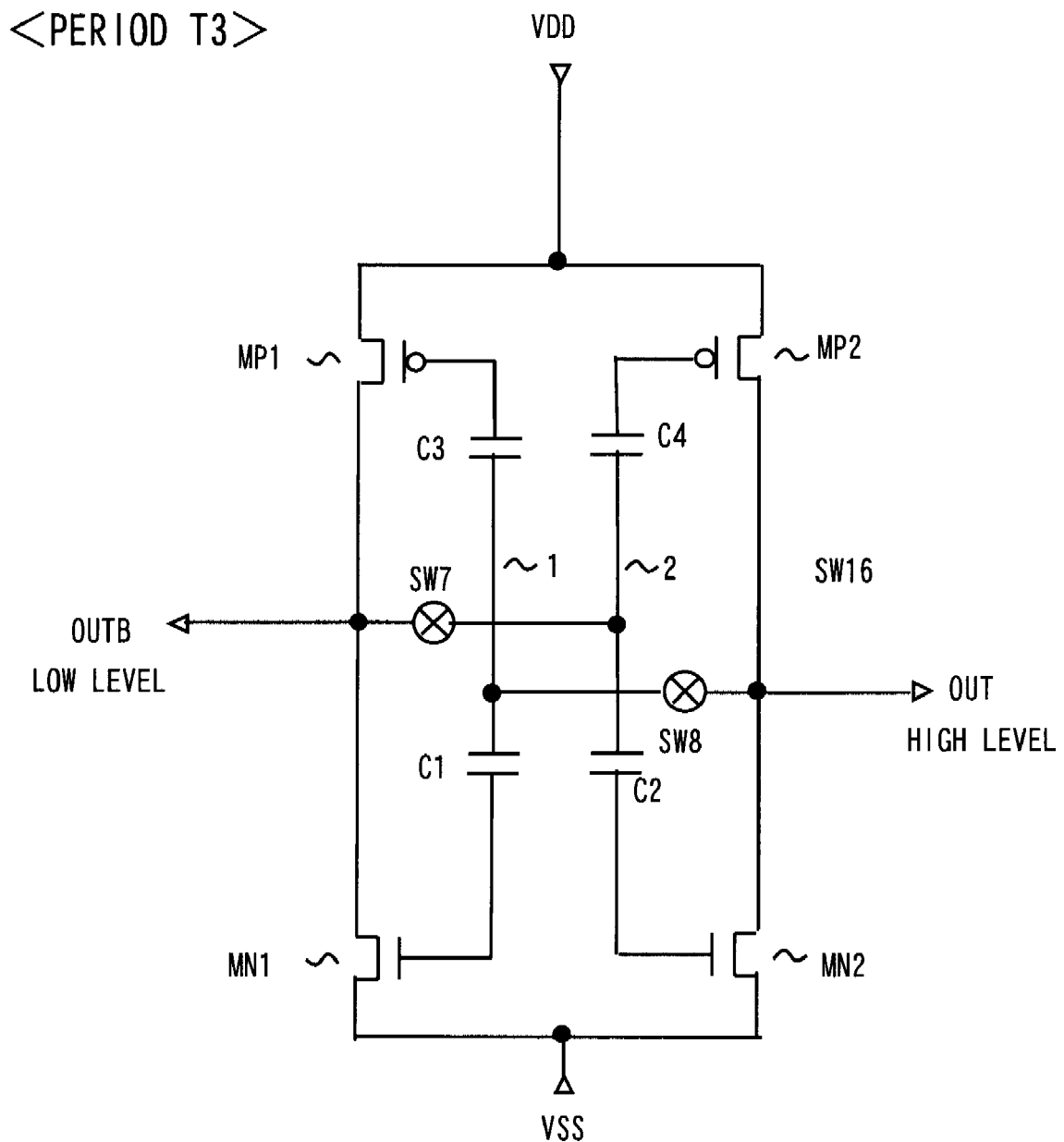
FIG. 11 is a diagram showing a connecting configuration during the period T3 in the second mode of the present invention.

FIG. 8 is a timing diagram showing operations that control switches of a circuit in FIG. 7. FIGS. 9, 10, and 11 are diagrams showing configurations of the circuit in FIG. 7 during the periods T1, T2, and T3 in FIG. 8, respectively. The operations when the data value (VR+Vd) using the voltage of the reference signal VR as the center value thereof and the complementary value (VR−Vd) of the data value (VR+Vd) are input as the input signals S1 and S2, respectively, as in the first example, will be described below.

Referring to FIGS. 8 and 9, during the period T1, the switches SW1, SW2, SW5, SW6, SW9, and SW10 are turned on, and the switches SW3 and SW4 are turned off, and the switches SW7 and SW8 are turned off. In each of the first inverter (constituted from the transistors MP1 and MN1) and the second inverter (constituted from the transistors MP2 and MN2), the bias signal BP is applied to the PMOS transistors MN1 and MN2, each of the NMOS transistors MN1 and MN2 is diode-connected, and the currents I1 and I2 that flow through the first inverter (constituted from the transistors MP1 and MN1) and the second inverter (constituted from the transistors MP2 and MN2), respectively, are controlled by the bias signal BP.

To the respective gates of the NMOS transistors MN1 and MN2 and the PMOS transistors MP1 and MP2, the reference signal VR is applied through the capacitances C1, C2, C3, and C4, respectively. A potential difference between the gate voltage of the NMOS transistor MN1 and the reference signal VR, a potential difference between the gate voltage of the NMOS transistor MN2 and the reference signal, a potential difference between a gate voltage of the PMOS transistor MP1 and the reference signal VR, and a potential difference between a gate voltage of the PMOS transistor MP2 and the reference signal VR are stored in the capacitances C1, C2, C3, and C4, respectively. More specifically, in the period T1, when the reference signal VR is input, the potential difference that causes the same current (I1) to flow through the transistors MN1 and MP1 of the first inverter is stored in the capacitance C1, and the potential difference that causes the same current (I2) to flow through the transistors MN2 and MP2 of the second inverter is stored in the capacitance C2, as in the first example. Further, in this example, a potential difference between the reference signal VR and the bias signal BP is stored in the capacitances C3 and C4, respectively. Still further, even when a variation in characteristics arises in one of the transistors MN1, MP1, MN2, and MP2, a condition that causes the same current to flow through the pair of the transistors in each inverter is formed with reliability. The period T1 is set to the reset period for properly performing the operations in the periods T2 and T3.

Next, referring to FIGS. 8 and 10, during the period T2, the switches SW1, SW2, SW5, SW6, SW9, and SW10 are turned off, the switches SW3 and SW4 are turned on, and the switches SW7 and SW8 are kept off.

In this case, the potential difference stored in each of the capacitances C1, C2, C3, and C4 is held in the same state as that during the period T1. Further, the data (VR+Vd) of the input signal S1 and the data (VR−Vd) of the input signal S2 are input to the input terminals (terminals 1 and 2) of the first and second inverters through the switches SW3 and SW4 that are in the on state, respectively. When the voltage Vd is positive, for example, in the first inverter, the drain current (source-to-drain current) of the PMOS transistor MP1 is reduced to become (I1−ΔIp1). Then, the drain current (drain-to-source current) of the NMOS transistor MN1 increases to become (I1+ΔIn1). The output (OUTB) of the first inverter (at the common drain node of the transistors MP1 and MN1) thereby greatly changes to the negative side (VSS side). On the other hand, in the second inverter, the drain current (source-to-drain current) of the PMOS transistor MP2 increases to become (I2+ΔIp2). Then, the drain current (drain-to-source current) of the NMOS transistor MN2 is reduced to become (I2−ΔIn2). The output (OUT) of the second inverter (at the common drain node of the transistors MP2 and MN2) thereby greatly changes to the positive side (VDD side).

Next, referring to FIGS. 8 and 11, during the period T3, the switches SW1, SW2, SW5, SW6, SW9, and SW10 are kept off, the switches SW3 and SW4 are turned off, and the switches SW7 and SW8 are turned on. The potential difference stored in each of the capacitances C1, C2, C3, and C4 is continuously held in the state of the period T1. As shown in FIG. 11, the output OUTB of the first inverter (constituted from the transistors MP1 and MN1) that has greatly changed to the negative side (VSS side) is connected to the input (terminal 2) of the second inverter (constituted from the MP2 and MN2) through the switch SW7 in the on state, and the output OUT of the second inverter (constituted from the transistors MP2 and MN2) that has greatly changed to the positive side (VDD side) is connected to the input (terminal 1) of the first inverter (constituted from the transistors MP1 and MN1) through the switch SW8 in the on state, thereby forming the flip-flop. The outputs OUT and OUTB that are complementary to each other then change to the HIGH (VDD) level and the LOW (VSS) level, respectively, resulting in a stabilized state.

As described above, in this example as well, the same effect as that in the first example can be implemented. Further, in this example, respective voltage levels of the digital data signal and the reference signal VR can be set to arbitrary voltage levels that do not depend on the threshold voltages of the transistors MP1, MN1, MP2, and MN2.

FIGS. 12A and 12B are timing diagrams showing examples of control over the switches when data is continuously input to at least one of the input signals S1 and S2. The first to third data periods and the Nth to (N+2)th data periods are shown in each of FIGS. 12A and 12B, in which N is an arbitrary positive number.

In an example shown in FIG. 12A, the control over the periods T1 to T3 is performed for each data.

In an example shown in FIG. 12B, the control over the periods T1 to T3 is performed during the first and Nth data periods. Then, during the subsequent data periods (at least during the second and third data periods and the (N+1)th and (N+2)th data periods), only the control over the periods T2 to T3 is performed (with the control over the period T1 omitted). Electric charges held in the capacitances C1, C2, C3 and C4, respectively, during each period T1 of the first and Nth data periods are used in the subsequent data periods as well. The data signal of a high frequency can also be thereby accommodated.

The above description was given in connection with the example described above. The present invention is not, however, limited to the configurations of the examples described above alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A signal amplifier comprising:
   first and second inverters, an input of said first inverter being connected to an output of the second inverter and an output of said first inverter being connected to an input of the second inverter, thereby forming a flip-flop;
   a control terminal of at least one transistor of first transistor pair constituting said first inverter, being connected through first capacitance to the input of said first inverter;
   a control terminal of at least one transistor of second transistor pair constituting said second inverter, being connected through second capacitance to the input of said second inverter;
   at a time of resetting, with the inputs and outputs of said first and second inverters being not mutually cross-connected, the inputs of said first and second inverters receiving a reference signal in common, said one transistors of said first and second transistor pairs being diode-connected, voltage differences between the reference signal and said respective control terminals of said one transistors being stored in said first capacitance and second capacitance, respectively; and
   at a time of signal input, the inputs of said first and second inverters being disconnected from the reference signal, the diode connections of said one transistors being released, the inputs of said first and second inverters receiving first and second input signals, respectively, and then the inputs and outputs of said first and second inverters being mutually cross-connected, thereby forming said flip-flop.

2. A signal amplifier comprising:
   first and second inverters, an input of said first inverter being connected to an output of the second inverter and an output of said first inverter being connected to an input of the second inverter, thereby forming a flip-flop;
   a control terminal of at least one transistor of first transistor pair constituting said first inverter, being connected through first capacitance to the input of said first inverter;
   a control terminal of at least one transistor of second transistor pair constituting said second inverter, being connected through second capacitance to the input of said second inverter;
   at a time of resetting, with the inputs and outputs of said first and second inverters not mutually cross-connected, the inputs of said first and second inverters receiving a reference signal in common, said one transistors of said first and second transistor pairs being diode-connected, control terminals of the other transistors receiving first and second bias signals, respectively, voltage differences between the reference signal and said respective control terminals of said one transistors being stored in said first capacitance and second capacitance, respectively; and
   at a time of signal input, the inputs of said first and second inverters being disconnected from the reference signal, said control terminals of the other transistors being disconnected from the first and second bias signals, the diode connections of said one transistors being released, the inputs of said first and second inverters receiving first and second input signals, respectively, and then the inputs and outputs of said first and second inverters being mutually cross-connected, thereby forming said flip-flop.

3. The signal amplifier according to claim 2, wherein the bias signal has a voltage equal to a voltage of the reference signal.

4. The signal amplifier according to claim 1 wherein at least one of the first input signal and the second input signal is a digital data signal, and the reference signal is set within a range of an amplitude of the digital data signal.

5. The signal amplifier according to claim 2, wherein said control terminal of the other transistor of said first transistor pair is connected through third capacitance to the input of said first inverter, said control terminal of the other transistor of said second transistor pair is connected through fourth capacitance to the input of said second inverter, and at the time of resetting, voltage differences between the reference signal and said respective control terminals of the other transistors are stored in said third and fourth capacitances, respectively.

6. The signal amplifier according to claim 1, wherein at the time of signal input, the inputs of said first and second inverters are disconnected from the reference signal, and receive the first and second input signals, respectively, and the inputs of said first and second inverters assume a disconnected state from the first and second input signals, respectively in which the inputs and the outputs of said first and second inverters are mutually cross-connected, thereby forming said flip-flop.

7. The signal amplifier according to claim 2, wherein at the time of signal input, the inputs of said first and second inverters are disconnected from the reference signal, and receive the first and second input signals, respectively, and the inputs of said first and second inverters assume a disconnected state from the first and second input signals, respectively in which the inputs and the outputs of said first and second inverters are mutually cross-connected, thereby forming said flip-flop.

8. A signal amplifier comprising:
   a first transistor of a first conductivity type and a first transistor of a second conductivity type connected in series between a first power supply and a second power supply, thereby forming a first inverter;
   a second transistor of said first conductivity type and a second transistor of said second conductivity type connected in series between said first power supply and said second power supply, thereby forming a second inverter;
   a first capacitance with one end thereof connected to a control terminal of the first transistor of said first conductivity type and with the other end thereof connected to a control terminal of the first transistor of said second conductivity type; and
   a second capacitance with one end thereof connected to a control terminal of the second transistor of said first conductivity type and with the other end thereof connected to a control terminal of the second transistor of said second conductivity type;
   said control terminals of the first and second transistors of said first conductivity type being set to inputs of said first and second inverters, respectively;
   the signal amplifier comprising:
   a control circuit that exercises control over switching among first to third connection states:
   the first connection state where an output of said first inverter is disconnected from an input of said second inverter; an output of said second inverter is disconnected from an input of said first inverter, the inputs of said first and second inverters are connected in common to a reference signal, and the first and second transistors of said second conductivity type are diode-connected, respectively;

the second connection state where the diode connections of the first and second transistors of said second conductivity type are released, and first and second input signals are supplied to the inputs of said first and second inverters, respectively; and the third connection state where the output of said first inverter is connected to the input of said second inverter, and the input of said first inverter is connected to the output of said second inverter.

9. The signal amplifier according to claim 8, wherein in said third connection state, the inputs of said first and second inverters are disconnected from input terminals for the first and second input signals, respectively.

10. The signal amplifier according to claim 8, wherein said control circuit comprises:
a first switch connected between a supply terminal for the reference signal and the input of said first inverter and a second switch connected between said supply terminal for the reference signal and the input of said second inverter;
a third switch connected between an input terminal for the first input signal and the input of said first inverter and a fourth switch connected between an input terminal for the second input signal and the input of said second inverter;
a fifth switch connected between said control terminal of the first transistor of said second conductivity type and the output of said first inverter;
a sixth switch connected between said control terminal of the second transistor of said second conductivity type and the output of said second inverter;
a seventh switch connected between the output of said first inverter and the input of said second inverter; and
an eighth switch connected between the output of said second inverter and the input of said first inverter.

11. The signal amplifier according to claim 10, wherein during a first period, said first switch, said second switch, said fifth switch, and said sixth switch are turned on, said third switch and said fourth switch are turned off, and said seventh switch and said eighth switch are turned off, thereby constituting said first connection state;

during a second period, said first switch, said second switch, said fifth switch, said sixth switch are turned off, said third switch and said fourth switch are turned on, and said seventh switch and said eighth switches are kept off, thereby constituting said second connection state; and during a third period, said first switch, said second switch, said fifth switch, and said sixth switch are kept off, said third switch and said fourth switch are turned off, and said seventh switch and said eighth switch are turned on, thereby constituting said third connection state.

12. The signal amplifier according to claim 8, wherein the reference signal has a voltage that causes the first and second transistors of said first conductivity type to be turned on.

13. A signal amplifier comprising:
a first transistor of a first conductivity type and a first transistor of a second conductivity type connected in series between a first power supply and a second power supply, thereby forming a first inverter;
a second transistor of said first conductivity type and a second transistor of said second conductivity type connected in series between said first power supply and said second power supply, thereby forming a second inverter;

first and third capacitances connected in series between a control terminal of the first transistor of said second conductivity type and a control terminal of the first transistor of said first conductivity type; and
second and fourth capacitances connected in series between a control terminal of the second transistor of said second conductivity type and a control terminal of the second transistor of said first conductivity type;
a connecting node between said first capacitance and said third capacitance being an input of said first inverter;
a connecting node between said second capacitance and said fourth capacitance being an input of said second inverter;
the signal amplifier further comprising a control circuit that exercises control over switching among first, second and third connection states:
the first connection state where an output of said first inverter is disconnected from the input of said second inverter, and an output of said second inverter is disconnected from the input of said first inverter, a bias signal is applied in common to said control terminals of the first and second transistors of said first conductivity type, a reference signal is supplied in common to the inputs of said first and second inverters, and the first and second transistors of said second conductivity type are diode-connected, respectively;
the second connection state where the diode connections of the first and second transistors of said second conductivity type are released, a first input signal is supplied to the input of said first inverter, and a second input signal is supplied to the input of said second inverter; and
a third connection state where the output of said first inverter connected to the input of said second inverter, and the input of said first inverter is connected to the output of said second inverter.

14. The signal amplifier according to claim 13, wherein in said third connection state, the input of said first inverter is disconnected from an input terminal for the first input signal, and the input of the second inverter is disconnected from an input terminal for the second input signal.

15. The signal amplifier according to claim 13, wherein said control circuit comprises:
a first switch connected between a supply terminal for the reference signal and the input of said first inverter;
a second switch connected between said supply terminal for the reference signal and the input of said second inverter;
a third switch connected between said input terminal for the first input signal and the input of said first inverter;
a fourth switch connected between said input terminal for the second input signal and the input of said second inverter;
a fifth switch connected between said control terminal of the first transistor of said second conductivity type and the output of said first inverter;
a sixth switch connected between said control terminal of the second transistor of said second conductivity type and the output of said second inverter;
a seventh switch connected between the output of said first inverter and the input of said second inverter;
an eighth switch connected between the output of said second inverter and the input of said first inverter;
a ninth switch connected between a supply terminal for the bias signal and said control terminal of the first transistor of said first conductivity type; and a tenth switch connected between said supply terminal for the bias signal and said control terminal of the second transistor of said first conductivity type.

16. The signal amplifier according to claim 15, wherein during a first period, said first switch, said second switch, said fifth switch, said sixth switch, said ninth switch, and said tenth switch are turned on, said third switch and said fourth switch are turned off, and said seventh switch and said eighth switch are turned off, thereby constituting said first connection state;

during a second period, said first switch, said second switch, said fifth switch, said sixth switch, said ninth switch, and said tenth switch are turned off, said third switch and said fourth switch are turned on, and said seventh switch and said eighth switches are kept off, thereby constituting said second connection state; and during a third period, said first switch, said second switch, said fifth switch, said sixth switch, said ninth switch, and said tenth switch are kept off, said third switch and said fourth switch are turned off, and said seventh switch and said eighth switch are turned on, thereby constituting said third connection state.

17. The signal amplifier according to claim 1 wherein the second input signal is a complementary signal of the first input signal.

18. The signal amplifier according to claim 8 wherein at least one of the first input signal and the second input signal is a digital data signal, and the reference signal is set within a range of an amplitude of the digital data signal.

19. The signal amplifier according to claim 8, wherein the control over switching is exercised so that said first through three connection states are sequentially assumed by each of a plurality of data sequentially input to at least one of the first input signal and the second input signal.

20. The signal amplifier according to claim 8, wherein the control over switching is exercised so that said first through three connection states are sequentially assumed by initial data among a plurality of data sequentially input to at least one of the first input signal and the second input signal, and for a subsequent predetermined number of the sequential data, said first connection state is omitted, and said second and third states are assumed by the subsequent predetermined number of the sequential data.

21. The signal amplifier according to claim 1 wherein the transistors comprise a MOS transistor.

22. The signal amplifier according to claim 1 wherein the transistors comprise a thin film transistor.

23. A sense amplifier comprising the signal amplifier as set forth in claim 1.

24. A flip-flop type voltage comparator comprising the signal amplifier as set forth in claim 1.

25. A latch circuit comprising the signal amplifier as set forth in claim 1.

* * * * *